US011152280B2

(12) United States Patent
Sanda et al.

(10) Patent No.: US 11,152,280 B2
(45) Date of Patent: Oct. 19, 2021

(54) SEMICONDUCTOR DEVICE AND METHOD FOR MANUFACTURING THE SAME

(71) Applicant: Mitsubishi Electric Corporation, Tokyo (JP)

(72) Inventors: Yasuyuki Sanda, Tokyo (JP); Dai Nakajima, Tokyo (JP); Haruna Tada, Tokyo (JP); Hodaka Rokubuichi, Tokyo (JP); Kiyofumi Kitai, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/339,171

(22) PCT Filed: Nov. 16, 2017

(86) PCT No.: PCT/JP2017/041277
§ 371 (c)(1),
(2) Date: Apr. 3, 2019

(87) PCT Pub. No.: WO2018/097027
PCT Pub. Date: May 31, 2018

(65) Prior Publication Data
US 2019/0295919 A1 Sep. 26, 2019

(30) Foreign Application Priority Data
Nov. 24, 2016 (JP) .............................. JP2016-227897

(51) Int. Cl.
H01L 23/367 (2006.01)
H01L 23/29 (2006.01)
(Continued)

(52) U.S. Cl.
CPC ........ H01L 23/3675 (2013.01); H01L 21/565 (2013.01); H01L 23/29 (2013.01);
(Continued)

(58) Field of Classification Search
CPC ... H01L 23/3675; H01L 21/565; H01L 23/39; H01L 23/293; H01L 25/07; H01L 25/18
See application file for complete search history.

(56) References Cited

U.S. PATENT DOCUMENTS

2004/0040327 A1   3/2004  Iida et al.
2009/0200065 A1*  8/2009  Otoshi ................ H05K 3/0061
                                              174/252
(Continued)

FOREIGN PATENT DOCUMENTS

DE   11 2014 004 421 T5   6/2016
JP        H06005750 A     1/1994
(Continued)

OTHER PUBLICATIONS

Office Action (Notice of Reasons for Refusal) dated Apr. 22, 2020, by the Japanese Patent Office in corresponding Japanese Patent Application No. 2018-552535 and English translation of the Office Action. (6 pages).
(Continued)

Primary Examiner — Fernando L Toledo
Assistant Examiner — Valerie N Newton
(74) Attorney, Agent, or Firm — Buchanan Ingersoll & Rooney PC

(57) ABSTRACT

A semiconductor device includes a power module unit, a fin base, and a plurality of radiator fins. The power module unit and the fin base are integrated together, with a recess-projection portion formed on the power module unit being fitted to a recess-projection portion formed on the fin base. The plurality of radiator fins are integrally fitted on a heat radiation diffusion portion of the fin base.

13 Claims, 41 Drawing Sheets

(51) Int. Cl.
  *H01L 21/56* (2006.01)
  *H01L 23/31* (2006.01)
  *H01L 25/07* (2006.01)
  *H01L 25/18* (2006.01)

(52) U.S. Cl.
  CPC ........ *H01L 23/293* (2013.01); *H01L 23/3107* (2013.01); *H01L 25/07* (2013.01); *H01L 25/18* (2013.01)

(56) References Cited

U.S. PATENT DOCUMENTS

| | | |
|---|---|---|
| 2012/0227952 A1 | 9/2012 | Yoshihara et al. |
| 2014/0035122 A1 | 2/2014 | Nakazato et al. |
| 2016/0225691 A1* | 8/2016 | Sanda ................. H01L 23/3672 |

FOREIGN PATENT DOCUMENTS

| | | |
|---|---|---|
| JP | H0672247 U | 10/1994 |
| JP | 2011155118 A | 8/2011 |
| JP | 2012049167 A | 3/2012 |
| JP | 5236127 B1 | 7/2013 |
| JP | 2013165122 A | 8/2013 |
| JP | 2013229456 A | 11/2013 |
| JP | 2015072959 A | 4/2015 |
| WO | 2011061779 A1 | 5/2011 |

OTHER PUBLICATIONS

International Search Report (PCT/ISA/210) and Written Opinion (PCT/ISA/237) dated Feb. 6, 2018, by the Japan Patent Office as the International Searching Authority for International Application No. PCT/JP2017/041277.

Office Action dated Aug. 4, 2021, by the German Patent Office in corresponding German Patent Application No. 11 2017 005 953.4 and an English Translation of the Office Action. (15 Pages).

* cited by examiner

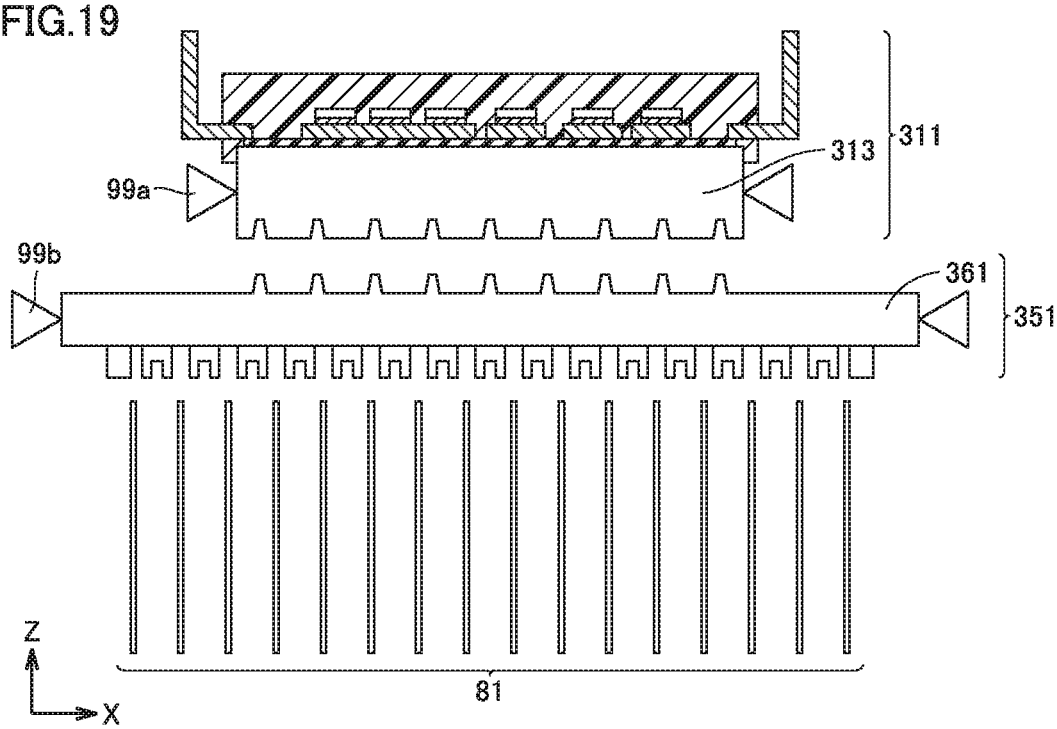
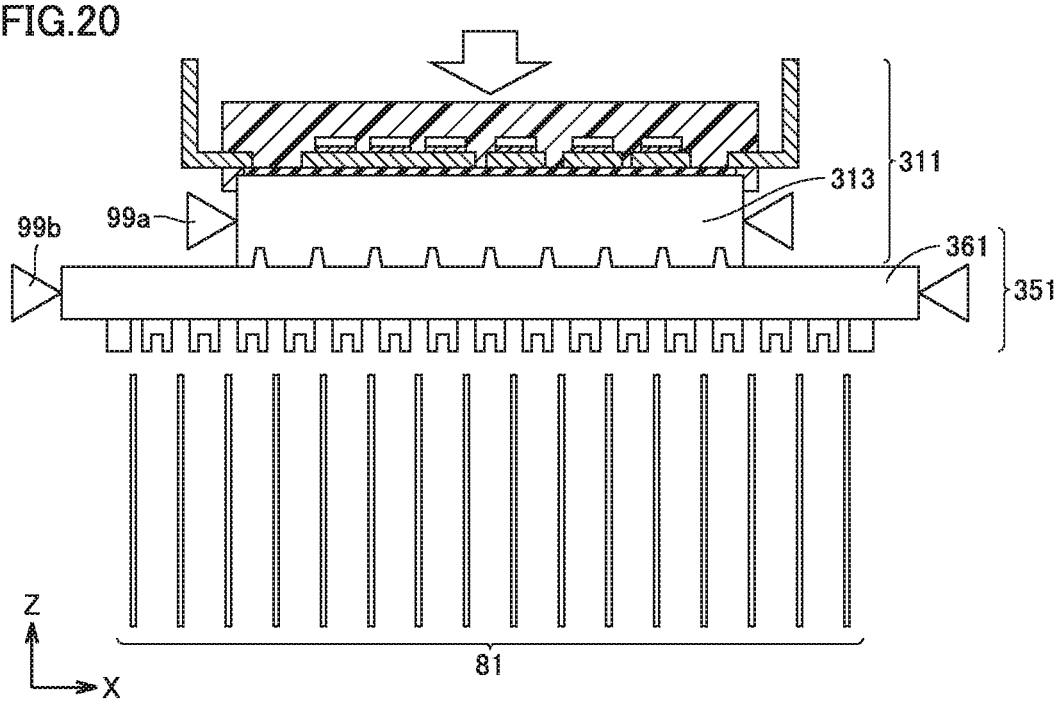

SEMICONDUCTOR DEVICE AND METHOD FOR MANUFACTURING THE SAME

TECHNICAL FIELD

The present invention relates to a semiconductor device and a method for manufacturing the same, and particularly to a semiconductor device mounted with a power semiconductor element and a method for manufacturing the semiconductor device.

BACKGROUND ART

As an example of a semiconductor device as a power module mounted with a power semiconductor element, there is a semiconductor device integrated with a heat sink that includes radiator fins to efficiently radiate heat generated at, for example, the power semiconductor element. Such a semiconductor device is disclosed in, for example, PTL 1, PTL 2, and PTL 3.

This type of semiconductor device includes a base plate having one side mounted with a power semiconductor element, the power semiconductor element being sealed with a mold resin. The other side of the base plate is fitted with a plurality of radiator fins to radiate heat generated from the power semiconductor element.

CITATION LIST

Patent Literature

PTL 1: Japanese Patent No. 5236127
PTL 2: Japanese Patent Laying-Open No. 2012-49167
PTL 3: WO 2011/061779

SUMMARY OF INVENTION

Technical Problem

In a semiconductor device, a power semiconductor element tailored to the intended use is mounted on a base plate. For example, if the power semiconductor element mounted on the semiconductor device has a relatively large amount of heat generation, large-size radiator fins are fitted on the base plate, so that the heat can be efficiently radiated. Also, the number of radiator fins fitted on the base plate is increased.

Thus, the base plate mounted with the power semiconductor element needs to be fitted with radiator fins tailored to the amount of heat generation (e.g. in size and number). A semiconductor device as a power module tailored to the base plate is manufactured.

An object of the present invention, which has been made as part of development of this type of semiconductor device, is to provide a semiconductor device that allows improved productivity. Another object is to provide a method for manufacturing such a semiconductor device.

Solution to Problem

A semiconductor device in the present invention is a semiconductor device comprising a power module unit, a fin base, and a radiator fin. The power module unit includes a module base, a power semiconductor element, and a mold resin. The power semiconductor element is mounted on the module base. The mold resin seals the power semiconductor element. The fin base includes a heat radiation diffusion portion and a base portion. The heat radiation diffusion portion is fitted with the radiator fin. The base portion is formed on the heat radiation diffusion portion, the module base being joined to the base portion.

A method for manufacturing a semiconductor device in the present invention includes the following steps. A power module unit is formed by mounting a power semiconductor element on a module base and by sealing the power semiconductor element with a mold resin so that a part of the module base is exposed, the part of the module base being on a side opposite to the power semiconductor element. A fin base is prepared, the fin base including: a heat radiation diffusion portion having a caulking portion and a radiator fin insertion groove; and a base portion formed on a part of the heat radiation diffusion portion, the part of the heat radiation diffusion portion being on a side opposite to the caulking portion and the radiator fin insertion groove. The power module unit and the fin base are placed so that the exposed part of the module base faces the base portion of the fin base, and each of a plurality of radiator fins is placed in the corresponding radiator fin insertion groove. The exposed part of the module base and the base portion of the fin base are joined together and the caulking portion is caulked to fit the plurality of radiator fins on the heat radiation diffusion portion by pressing the power module unit toward the fin base while a caulking jig is in contact with the caulking portion, thereby integrating the power module unit, the fin base, and the plurality of radiator fins together.

Advantageous Effects of Invention

According to the semiconductor device in the present invention, the power module unit which is mounted with the power semiconductor element, and the fin base which is fitted with the radiator fins are prepared as separate bodies. Thus, the productivity of the semiconductor device is improved.

According to the method for manufacturing a semiconductor device in the present invention, the power module unit mounted with the power semiconductor element and the fin base fitted with the radiator fins are individually manufactured.

This allows shared use of module base, thus contributing to the improvement of productivity of the semiconductor device.

BRIEF DESCRIPTION OF DRAWINGS

FIG. 19 is a side view including a partial cross section, showing one process in a method for manufacturing a semiconductor device in the third comparative example.

FIG. 20 is a side view including a partial cross section showing a process to be performed after the process shown in FIG. 19.

DESCRIPTION OF EMBODIMENTS

Embodiment 1

Figure 1:
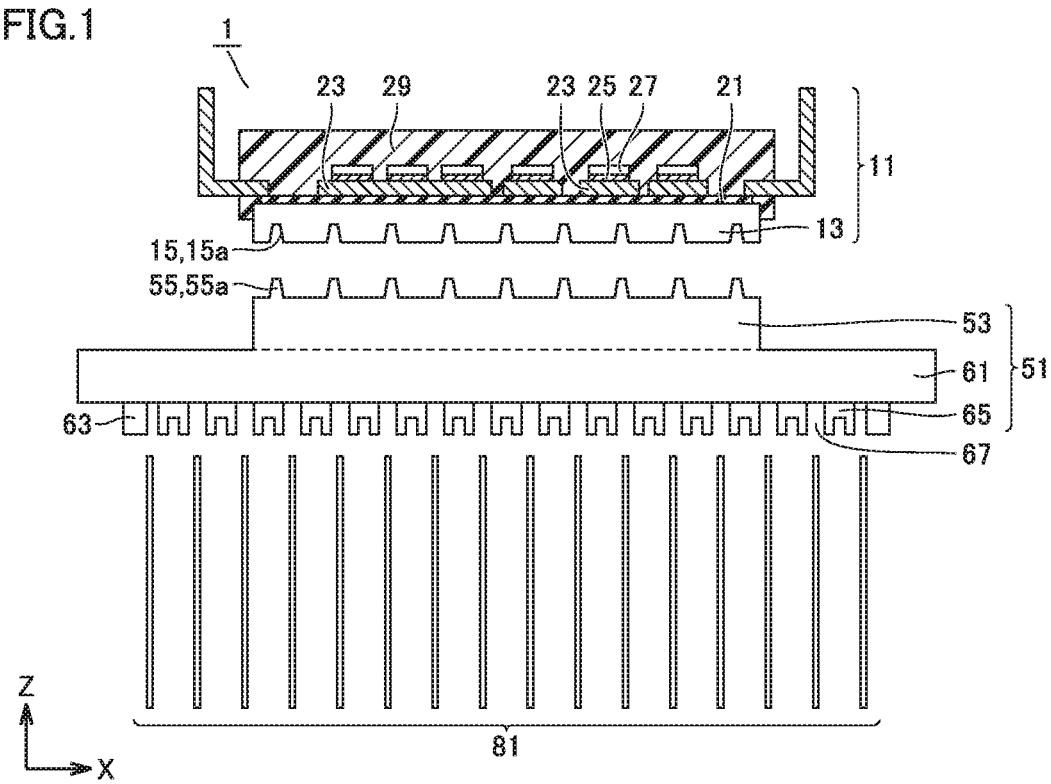
FIG. 1 is an exploded side view including a partial cross section of a semiconductor device in embodiment 1.

A semiconductor device in embodiment 1 is described. FIG. 1 shows an exploded side view including a partial cross section of the semiconductor device. As shown in FIG. 1, semiconductor device 1 includes a power module unit 11, a fin base 51, and a plurality of radiator fins 81.

Power module unit 11 and fin base 51 are joined and integrated together, with a recess-projection portion 15 formed on power module unit 11 being fitted to a recess-projection portion 55 formed on fin base 51.

In power module unit 11, a chip 27 having a power semiconductor element is mounted on one surface of module base 13. A lead frame 23 is disposed on the one surface of module base 13, with an insulating sheet 21 interposed therebetween. Chip 27 is joined to lead frame 23 via a solder 25.

Figure 2:
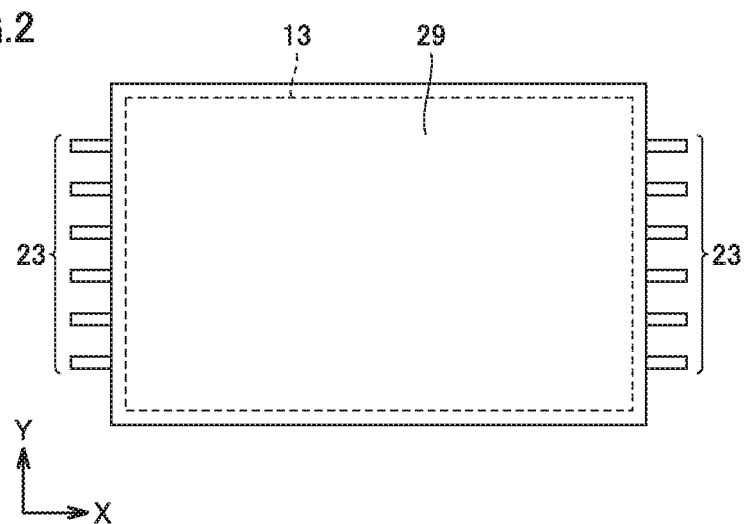
FIG. 2 is a top view of a power module unit in the semiconductor device shown in FIG. 1 in the above-mentioned embodiment.
Figure 3:
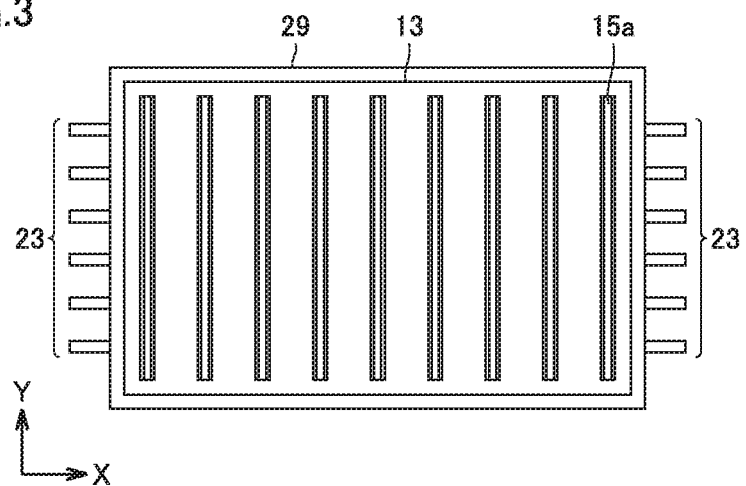
FIG. 3 is a bottom view of the power module unit in the semiconductor device shown in FIG. 1 in the above-mentioned embodiment.

Further, as shown in FIG. 2 and FIG. 3, chip 27 etc. is sealed with a mold resin 29. A part of lead frame 23 protrudes from side faces of mold resin 29, as an external terminal. The other surface of module base 13 is exposed. On the exposed surface of module base 13, recess-projection portion 15 is formed. Recesses 15a of recess-projection portion 15 extend along, for example, the Y-axis direction. Recess-projection portion 15 refers to the shape of the entire surface of module base 13 including recesses 15a.

Figure 4:
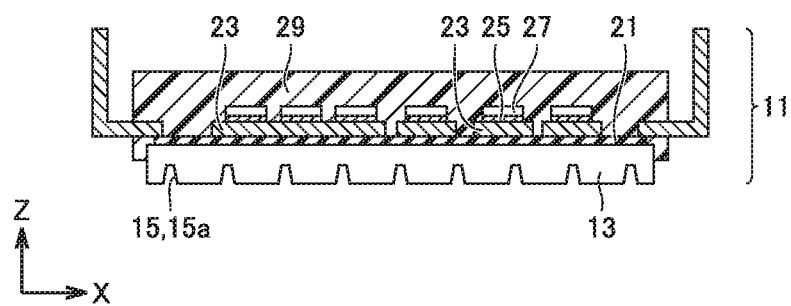
FIG. 4 is a first cross-sectional view for explaining the power module unit in the above-mentioned embodiment.
Figure 5:
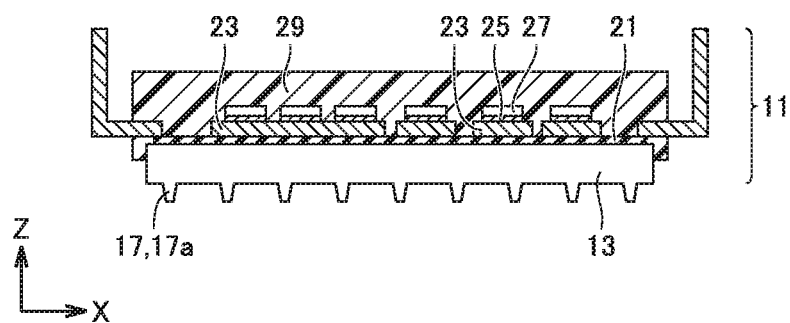
FIG. 5 is a second cross-sectional view for explaining the power module unit in the above-mentioned embodiment.

The recess-projection portion formed on the surface of module base 13 is described. FIG. 4 shows module base 13 which has recess-projection portion 15 including recesses 15a. Between recess 15a and recess 15a, a flat portion is formed. FIG. 5 shows module base 13 which has a recess-projection portion 17 including projections 17a. At the apex of each projection 17a, a flat portion is formed.

The productivity is improved both when module base 13 has recess-projection portion 15 and when module base 13 has recess-projection portion 17. However, the productivity is more effectively improved when module base 13 has recess-projection portion 15, than when module base 13 has recess-projection portion 17. The explanation for this fact is given below.

For temporarily bonding the insulating sheet to the module base, the module base needs to be heated to a certain temperature as a preparation process. Also for sealing the chip, the lead frame, etc. with the mold resin, the module base needs to be heated to a certain temperature as a preparation process.

Figure 6:
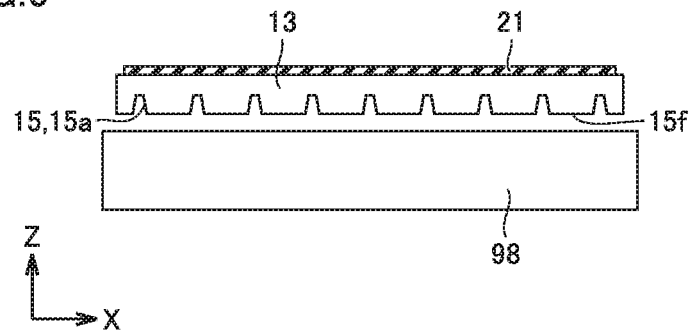
FIG. 6 is a first cross-sectional view for explaining a module base in the above-mentioned embodiment.
Figure 7:
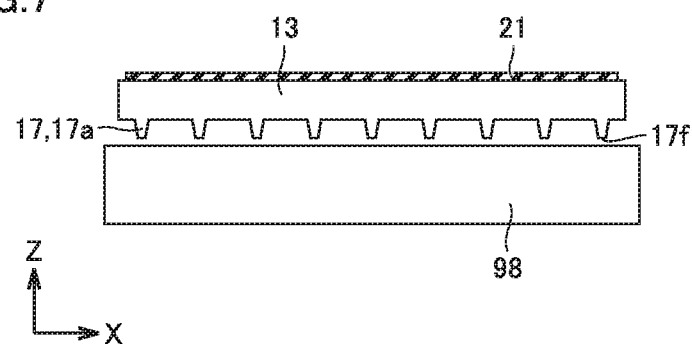
FIG. 7 is a second cross-sectional view for explaining the module base in the above-mentioned embodiment.

At this time, when module base 13 has recess-projection portion 15, the portion of module base 13 other than recesses 15a will come into contact with a heat block 98, as shown in FIG. 6. On the other hand, when module base 13 has recess-projection portion 17, projections 17a on module base 13 will come into contact with heat block 98, as shown in FIG. 7.

The contact areas between module base 13 and heat block 98 being compared, the contact area of when module base 13 has recess-projection portion 15 is larger than that of when module base 13 has recess-projection portion 17. That is, the area of a flat portion 15f formed between recess 15a and recess 15a is larger than the area of a flat portion 17f formed at the apex of each projection 17a. Accordingly, the preheating time for heating module base 13 to a certain temperature can be set to shorter when module base 13 has recess-projection portion 15. As a result, the productivity is higher when module base 13 has recess-projection portion 15.

Figure 8:
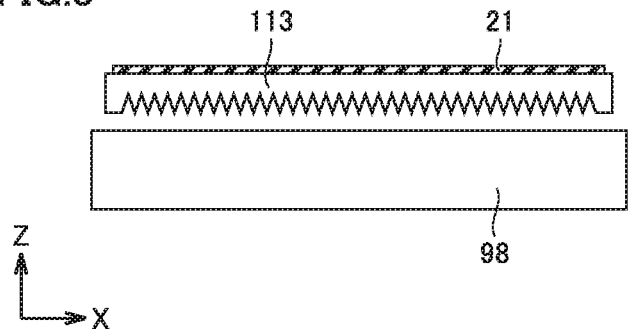
FIG. 8 is a cross-sectional view for explaining a module base in a first comparative example.

Further, the semiconductor device is compared with semiconductor devices in comparative examples. As a first comparative example, FIG. 8 shows module base 13 having recess-projection portion 15. In the first comparative example, a flat portion is not substantially formed between recess 15a and recess 15a, for fit with the projections and recesses provided on a heat radiator member (not shown). Accordingly, in the first comparative example, the contact area between module base 13 and heat block 98 is small. The first comparative example, therefore, requires a long preheating time to heat module base 13 to a certain temperature.

Figure 9:
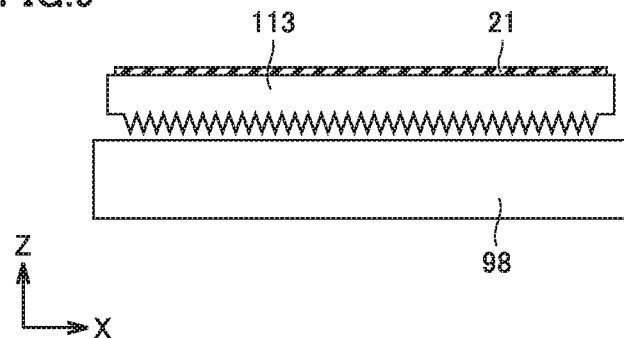
FIG. 9 is a cross-sectional view for explaining a module base in a second comparative example.

As a second comparative example, FIG. 9 shows module base 13 having recess-projection portion 17. In the second comparative example, a flat portion is not substantially formed at the apex of each projection 17a, for fit with the projections and recesses provided on a heat radiator member (not shown). Accordingly, in the second comparative example, the contact area between module base 13 and heat block 98 is small. The second comparative example, therefore, requires a long preheating time to heat module base 13 to a certain temperature.

Unlike the first and second comparative examples, in the semiconductor device in the embodiment, the flat portion provided on recess-projection portion 15, 17 of module base 13 allows a large contact area between module base 13 and heat block 98. This contributes to the improvement of productivity.

A smaller thickness (Z direction) of module base 13 is more preferable. Module base 13 having a small thickness, however, may deform due to a molding pressure during molding. In order to avoid such deformation, module base 13 preferably has a thickness of, for example, about 1.5 to 15 mm, more preferably about 3.0 to 8.0 mm.

Figure 10:
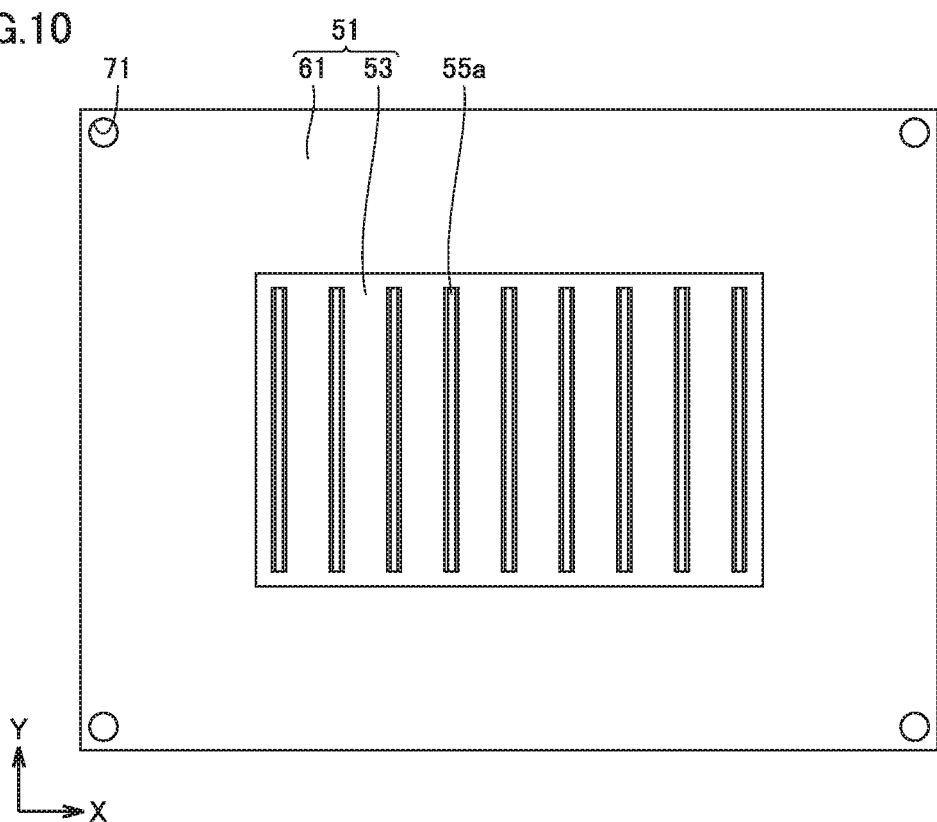
FIG. 10 is a top view of a fin base in the semiconductor device shown in FIG. 1 in the above-mentioned embodiment.

Fin base 51 comprises a heat radiation diffusion portion 61 and a base portion 53. Heat radiation diffusion portion 61 and base portion 53 have their respective thicknesses. Further, as shown in FIG. 10, base portion 53 is formed on one side of heat radiation diffusion portion 61. On a surface of base portion 53, recess-projection portion 55 is formed. Projections 55a of recess-projection portion 55 extend along, for example, the Y-axis direction. Recess-projection portion 55 refers to the entire shape of one surface of heat radiation diffusion portion 61 including projections 55a.

Here, the product of the width (X direction) and the depth (Y direction) of module base 13 is defined as the cross-sectional area of module base 13. The product of the width (X direction) and the depth (Y direction) of heat radiation diffusion portion 61 is defined as the cross-sectional area of heat radiation diffusion portion 61. Then, in order to improve the heat radiation performance, heat radiation diffusion portion 61 is preferably larger in cross-sectional area than module base 13. Also, in order to improve the productivity by standardizing the power module, heat radiation diffusion portion 61 is preferably larger in cross-sectional area than module base 13. Satisfying this relation in cross-sectional area is not essential, and the desired improvement of productivity can still be achieved without satisfying the relation.

Figure 11:
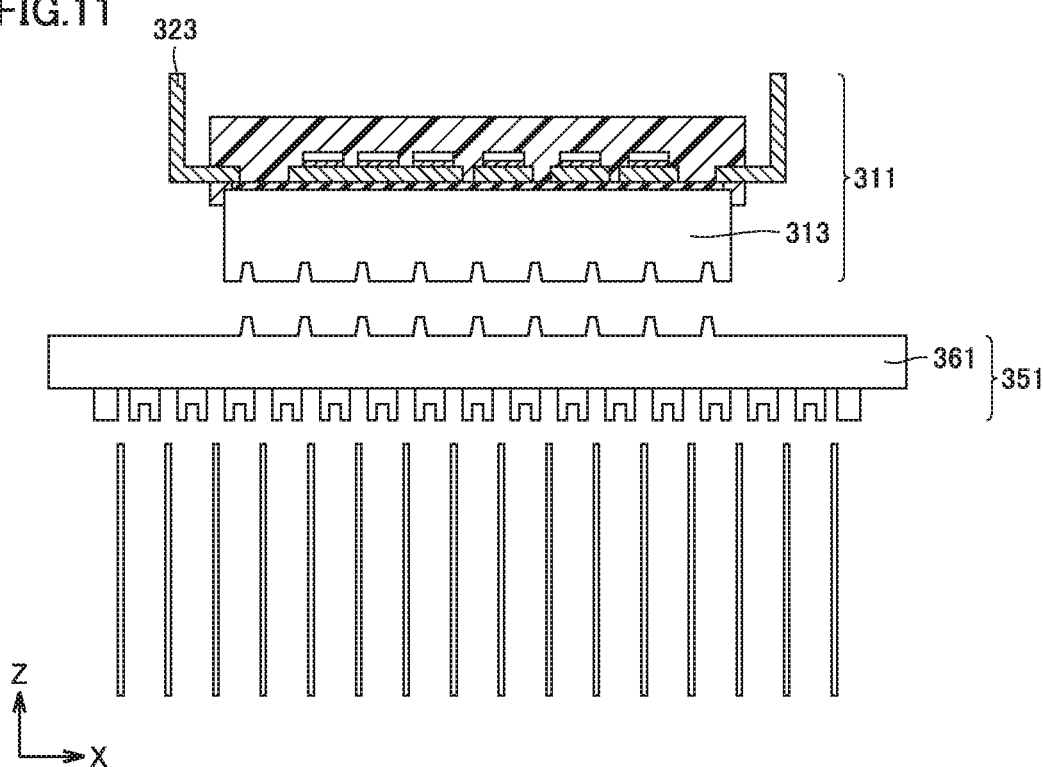
FIG. 11 is a side view including a partial cross section showing a state before integration, for explaining a semiconductor device in a third comparative example.
Figure 12:
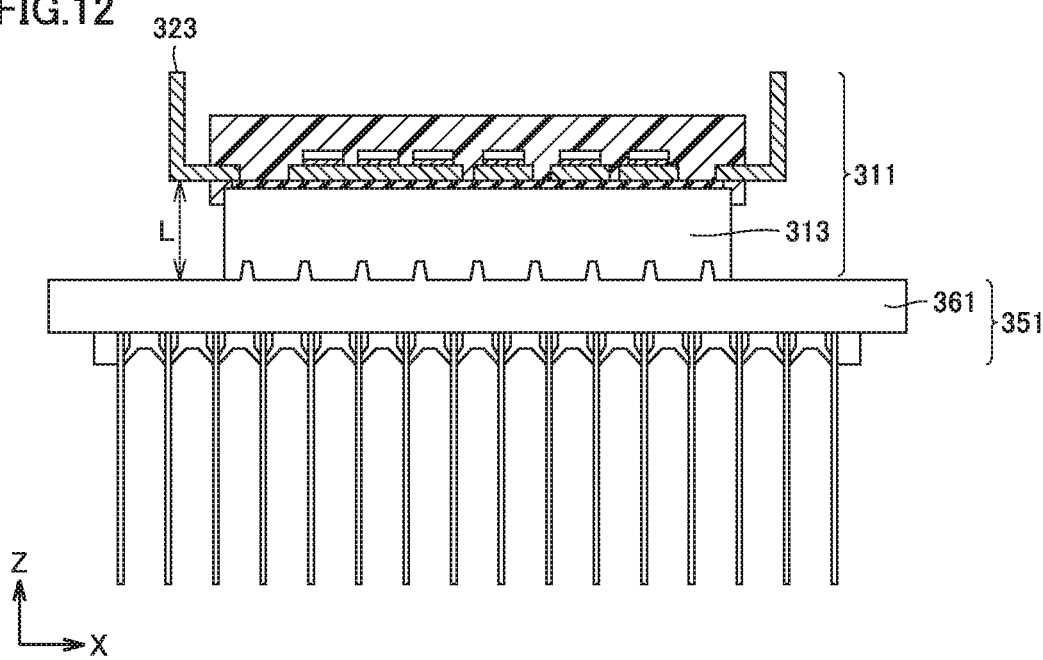
FIG. 12 is a side view including a partial cross section showing a state after integration, for explaining the semiconductor device in the third comparative example.

Next, the advantages in design of fin base 51 having a two-tiered structure, base portion 53 and heat radiation diffusion portion 61, are described. As a third comparative example, FIG. 11 and FIG. 12 show a semiconductor device which includes a fin base 351 having a single-tiered structure with no base portion. FIG. 11 shows a power module unit 311 and fin base 351 before integration. FIG. 12 shows power module unit 311 and fin base 351 after integration.

In the state in which power module unit 311 and fin base 351 are integrated together, lead frame 23 and heat radiation diffusion portion 361 of fin base 351, which are conductors, need to be separated from each other by a desired insulation distance L. Accordingly, in the third comparative example, a module base 313 of power module unit 311 needs to have a thickness equivalent to the insulation distance. Module base 313 having a larger thickness, however, has a higher heat capacity. This requires a longer preheating time to heat the above-described heat module base 313 to a certain temperature, thus reducing the productivity.

Figure 13:
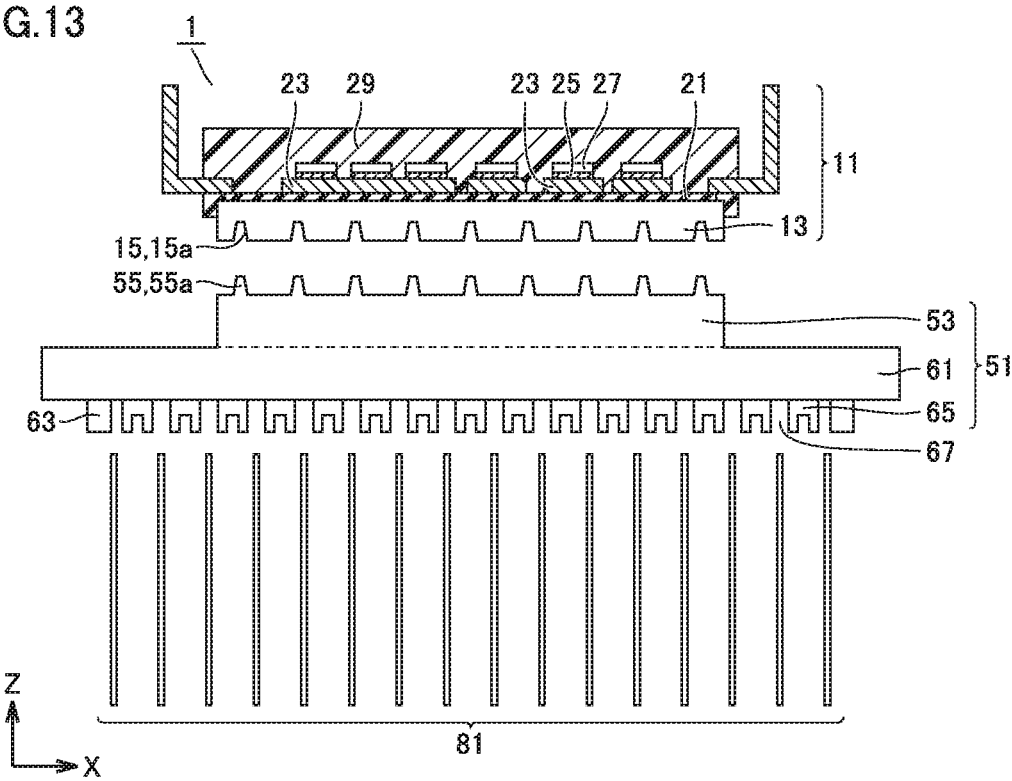
FIG. 13 is a side view including a partial cross section showing a state before integration, for explaining the semiconductor device in the above-mentioned embodiment.
Figure 14:
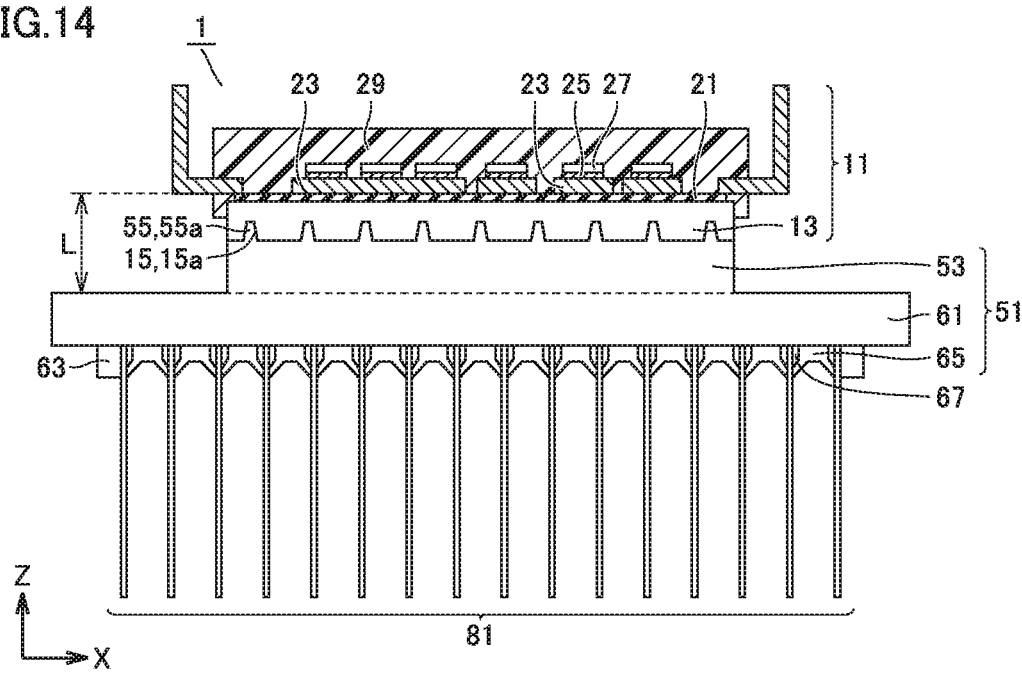
FIG. 14 is a side view including a partial cross section showing a state after integration, for explaining the semiconductor device in the above-mentioned embodiment.

In contrast, FIG. 13 and FIG. 14 show a semiconductor device including fin base 51 having a two-tiered structure. FIG. 13 shows power module unit 11 and fin base 51 before integration. FIG. 14 shows power module unit 11 and fin base 51 after integration. In this case, the thickness obtained by adding the thickness of module base 13 of power module unit 11 and the thickness of base portion 53 of fin base 51 may be the thickness equivalent to insulation distance L.

Accordingly, the thickness of module base 13 can be smaller than the thickness of module base 313 in the third comparative example. This allows a shorter preheating time to heat module base 13 to a certain temperature, thus contributing to the improvement of productivity. The advantages of base portion 53 in integrating module base 13 and base portion 53 of fin base 51 together are described later.

A smaller thickness of base portion 53 of fin base 51 is more preferable. In order to ensure the insulation distance, however, base portion 53 preferably has a thickness of about 1.5 to 15 mm, more preferably about 3.0 to 8.0 mm.

A smaller thickness of heat radiation diffusion portion 61 of fin base 51 is more preferable. In integrating module base 13 and base portion 53 of fin base 51 together, however, heat radiation diffusion portion 61 may plastically deform. Accordingly, heat radiation diffusion portion 61 preferably has a thickness of about 3.0 to 30 mm, more preferably about 6.0 to 16.0 mm.

Figure 15:
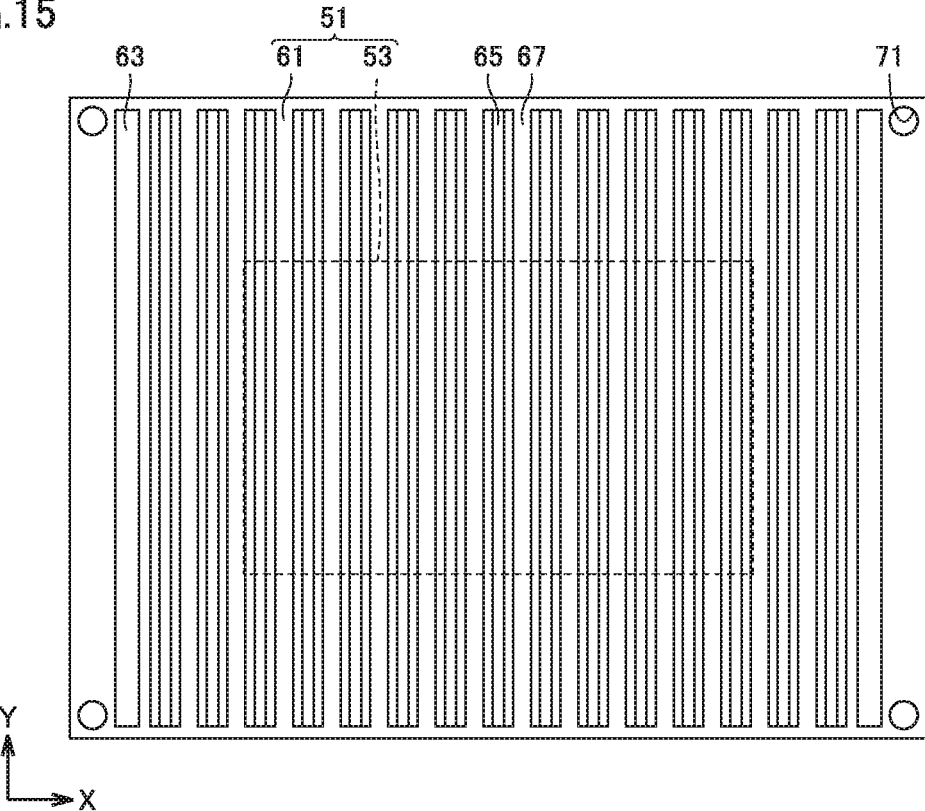
FIG. 15 is a bottom view of the fin base in the semiconductor device shown in FIG. 1 in the above-mentioned embodiment.

Further, as shown in FIG. 15, the other surface of heat radiation diffusion portion 61 has a plurality of caulking portions 65 and a plurality of convex wall portions 63. A plurality of caulking portions 65 extend along, for example, the Y-axis direction and disposed at intervals along the X-axis direction. Between caulking portion 65 and caulking portion 65, a fin insertion groove 67 is formed. At each of outermost caulking portions 65 (in the positive and negative directions on the X-axis), fin insertion groove 67 is formed between caulking portion 65 and convex wall portion 63.

As described later, on fin base 51, caulking portions 65 are caulked with radiator fins 81 being inserted in respective fin insertion grooves 67. Thus, a plurality of radiator fins 81 are integrally fitted on heat radiation diffusion portion 61, and a semiconductor device integrated with a heat sink is constructed.

Next, one example of a method for manufacturing the above-described semiconductor device is described. First, chip 27 having a power semiconductor element is mounted on module base 13 and is sealed with mold resin 29, thus forming power module unit 11 (see FIG. 16).

Fin base 51 is prepared, the size of fin base 51 corresponding to the amount of heat generation (heat density) from chip 27. Radiator fins 81 are also prepared, the size or number of radiator fins 81 corresponding to the amount of heat generation (see FIG. 16).

Figure 16:
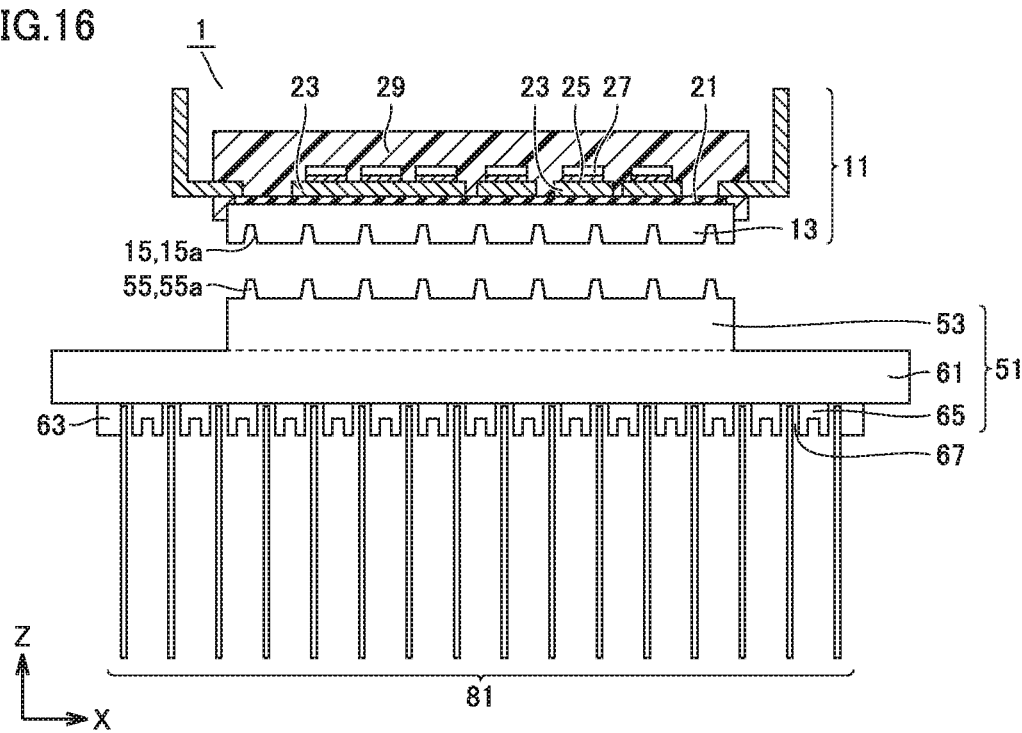
FIG. 16 is a side view including a partial cross section, showing one process in a method for manufacturing a semiconductor device in the above-mentioned embodiment.

Next, as shown in FIG. 16, power module unit 11 and fin base 51 are arranged so that recess-projection portion 15 of module base 13 of power module unit 11 faces recess-projection portion 55 of the base portion of fin base 51. Further, radiator fins 81 are inserted in respective fin insertion grooves 67 in heat radiation diffusion portion 61 of fin base 51.

Figure 17:
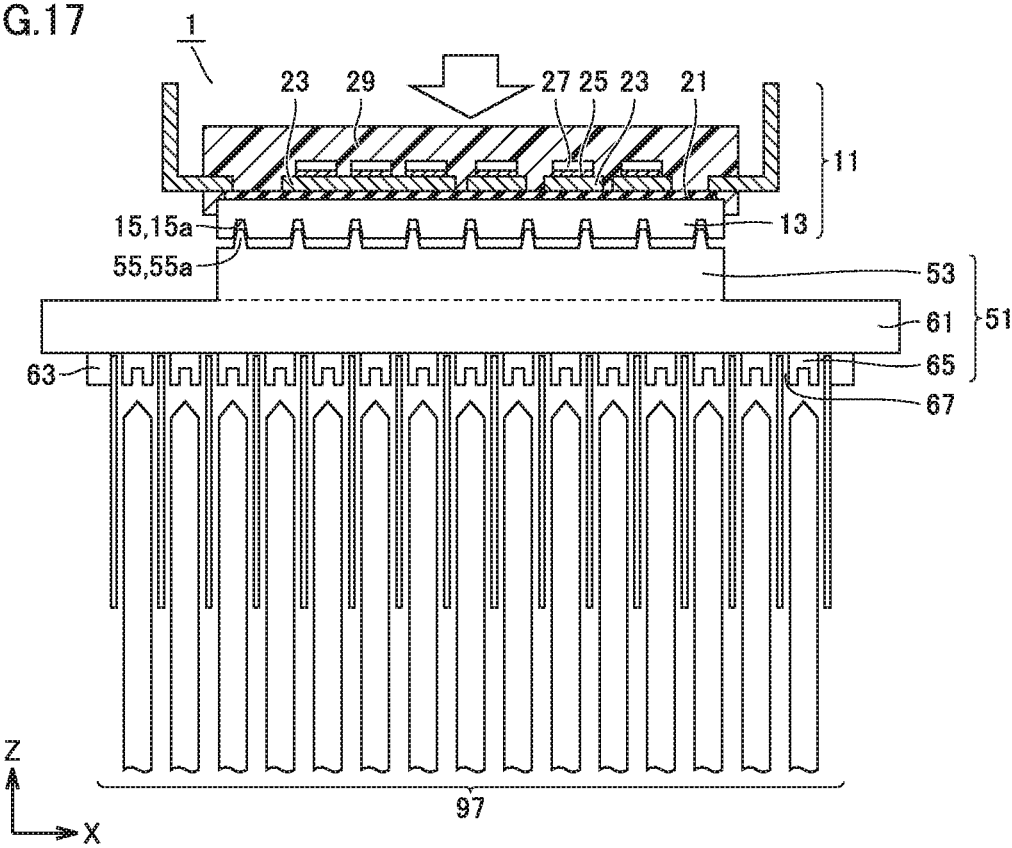
FIG. 17 is a side view including a partial cross section showing a process to be performed after the process shown in FIG. 16 in the above-mentioned embodiment.
Figure 18:
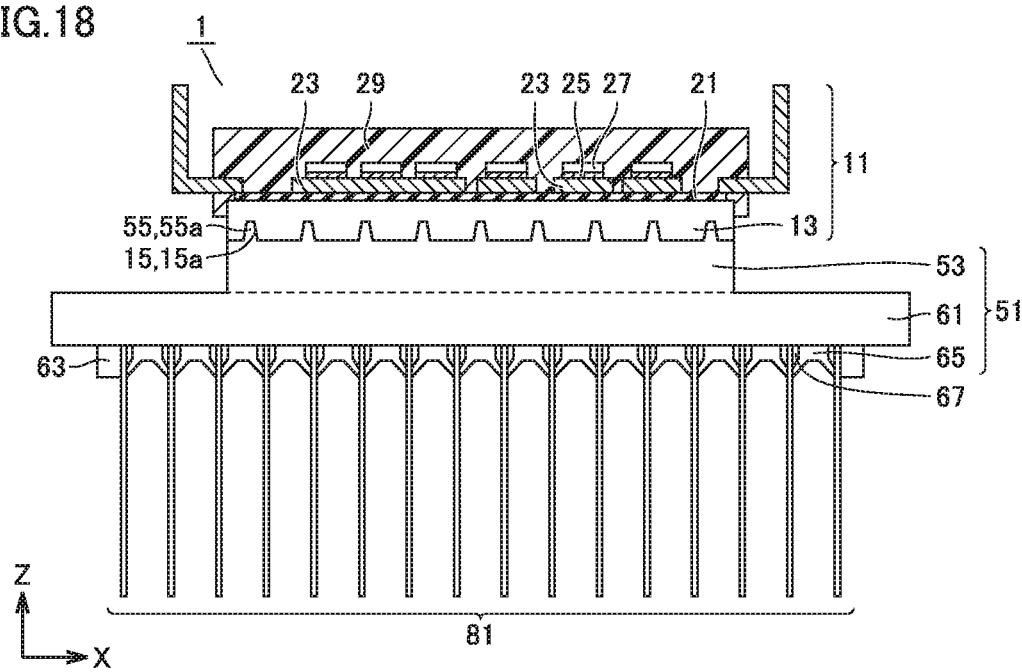
FIG. 18 is a side view including a partial cross section showing a process to be performed after the process shown in FIG. 17 in the above-mentioned embodiment.

Next, as shown in FIG. 17, press blades 97 are each inserted between radiator fin 81 and radiator fin 81 of a plurality of radiator fins 81 and each come into contact with caulking portion 65. Power module unit 11 is then pressed from above (see the arrow). When power module unit 11 is pressed, recess-projection portion 15 (recesses 15a) of power module unit 11 is fitted to recess-projection portion 55 (projections 55a) of base portion 53 of fin base 51, as shown in FIG. 18. Thus, power module unit 11 is joined to fin base 51.

From the viewpoint of the manufacturing process of the semiconductor device, the advantages of fin base 51 having a two-tiered structure, base portion 53 and heat radiation diffusion portion 61, are described.

Figure 21:
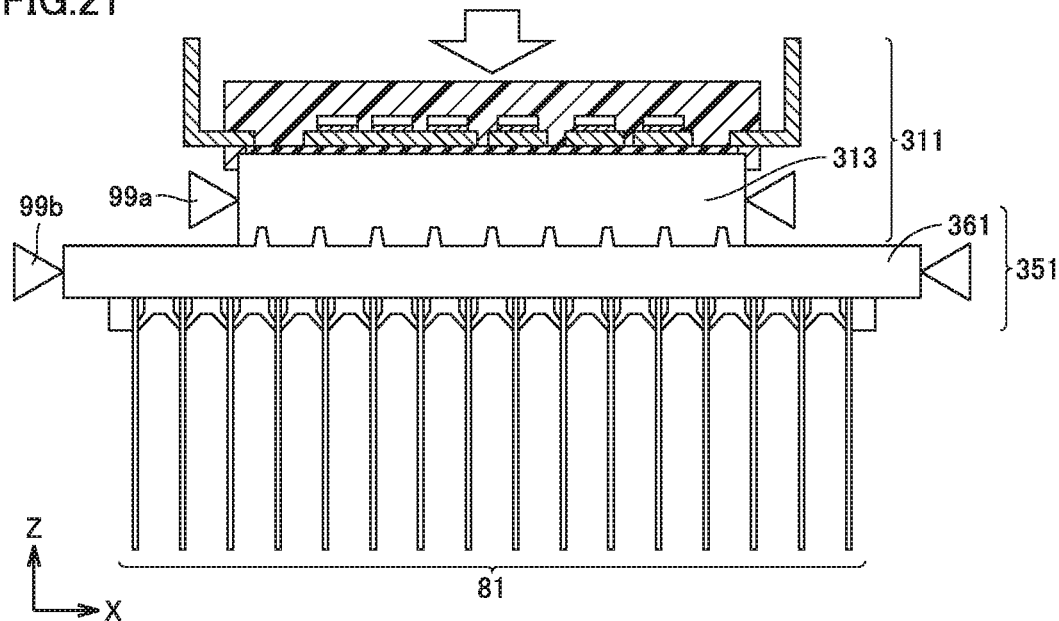
FIG. 21 is a side view including a partial cross section showing a process to be performed after the process shown in FIG. 20.

First, the semiconductor device in the above-described third comparative example is described. FIG. 19, FIG. 20, and FIG. 21 show one example of a manufacturing process. FIG. 19 shows power module unit 311 and fin base 351 before integration. Module base 313 of power module unit 311 is held by a first clamping jig 99a. Heat radiation diffusion portion 361 of fin base 351 is held by a second clamping jig 99b.

FIG. 20 shows power module unit 311 and fin base 351 integrated together. Module base 313 and heat radiation diffusion portion 361 are caulked by pressing module base 313, which is held by first clamping jig 99a, toward heat radiation diffusion portion 361, which is held by second clamping jig 99b. FIG. 21 shows radiator fins 81 and fin base 351 integrated together. Radiator fins 81 are caulked onto fin base 351.

Figure 22:
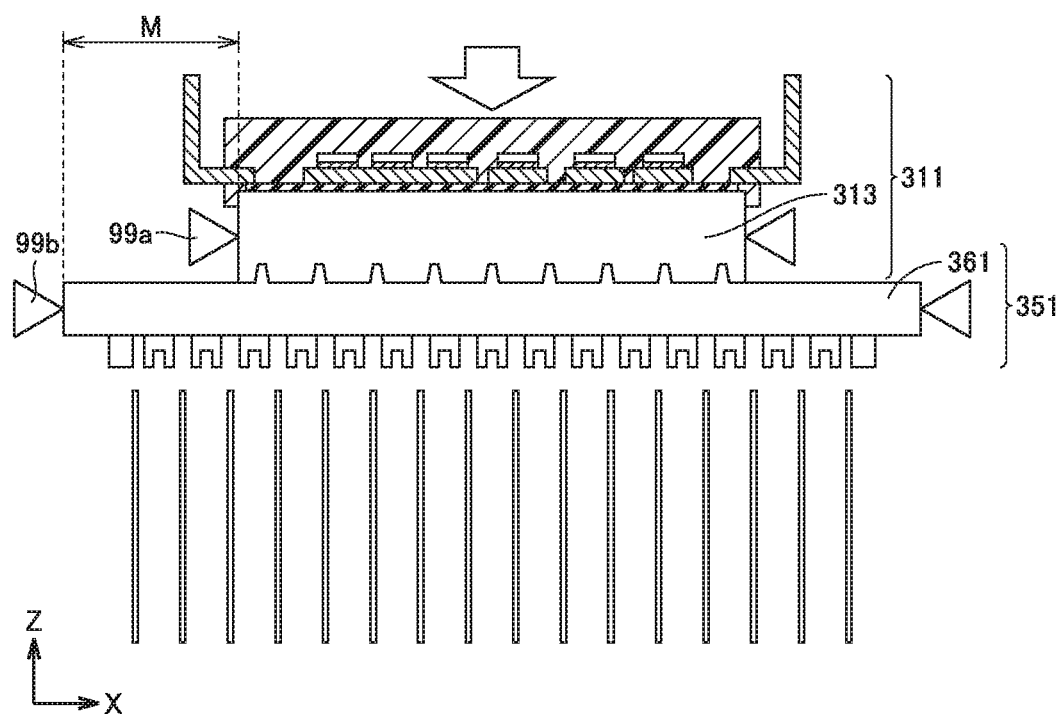
FIG. 22 is a first side view including a partial cross section, for explaining the problems of the semiconductor device in the third comparative example.
Figure 23:
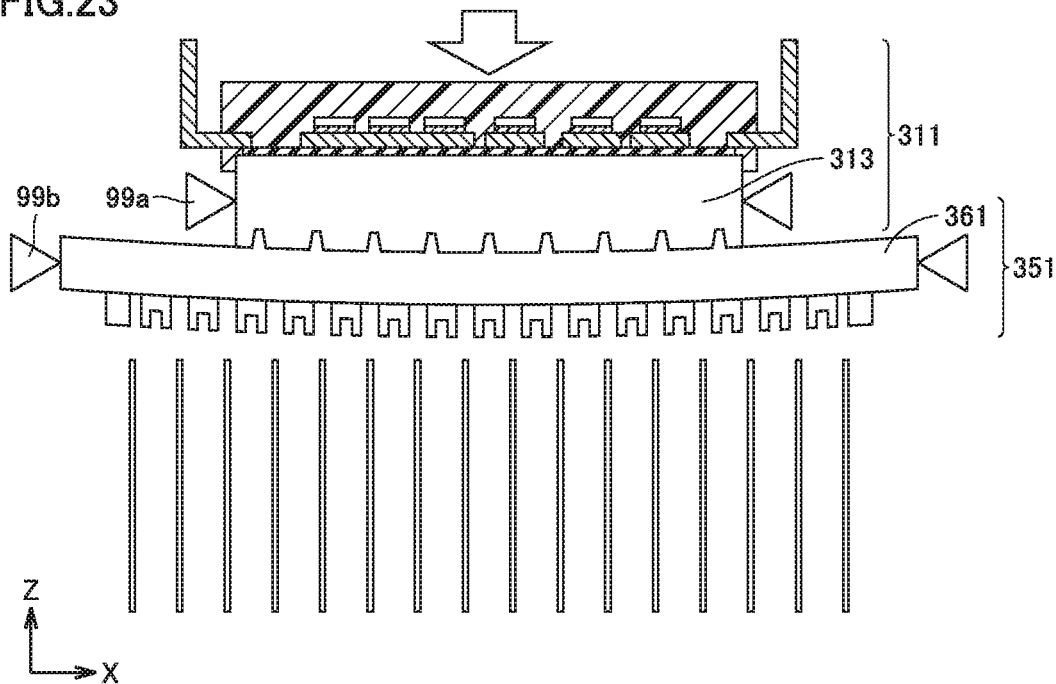
FIG. 23 is a second side view including a partial cross section, for explaining the problems of the semiconductor device in the third comparative example.

The problems that may occur in the third comparative example are shown in FIG. 22 and FIG. 23. As shown in FIG. 22, for integrating power module unit 311 and fin base 351 together, power module unit 311 is pressed toward heat radiation diffusion portion 361. At this time, the position (X direction) of second clamping jig 99b that holds heat radiation diffusion portion 361 is a distance M away from the position (X direction) of first clamping jig 99a that holds module base 313 of power module unit 311.

Accordingly, in heat radiation diffusion portion 361, the applied pressure acts on the position (point of effort) supported by first clamping jig 99a, which is distance M away from the position (fulcrum) supported by second clamping jig 99b. Thus, the applied pressure acting on power module unit 311 causes an increased moment on fin base 351. As a result, fin base 351 may plastically deform as shown in FIG. 23.

Figure 24:
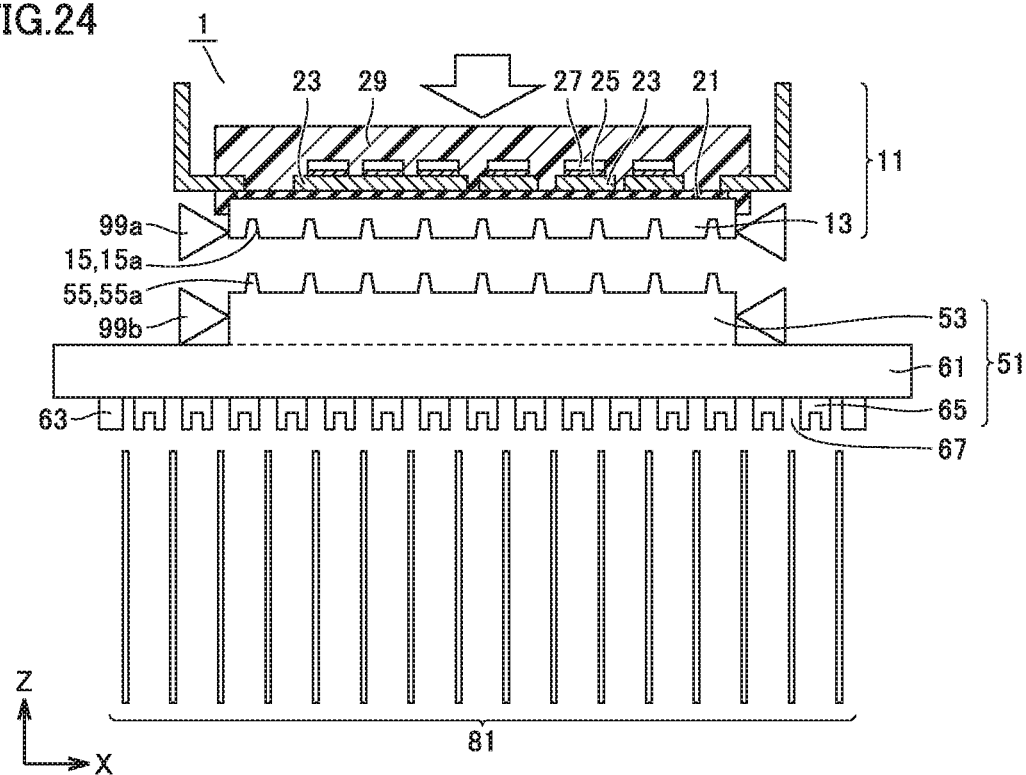
FIG. 24 is a first side view including a partial cross section for explaining the advantages of the semiconductor device in the above-mentioned embodiment.
Figure 25:
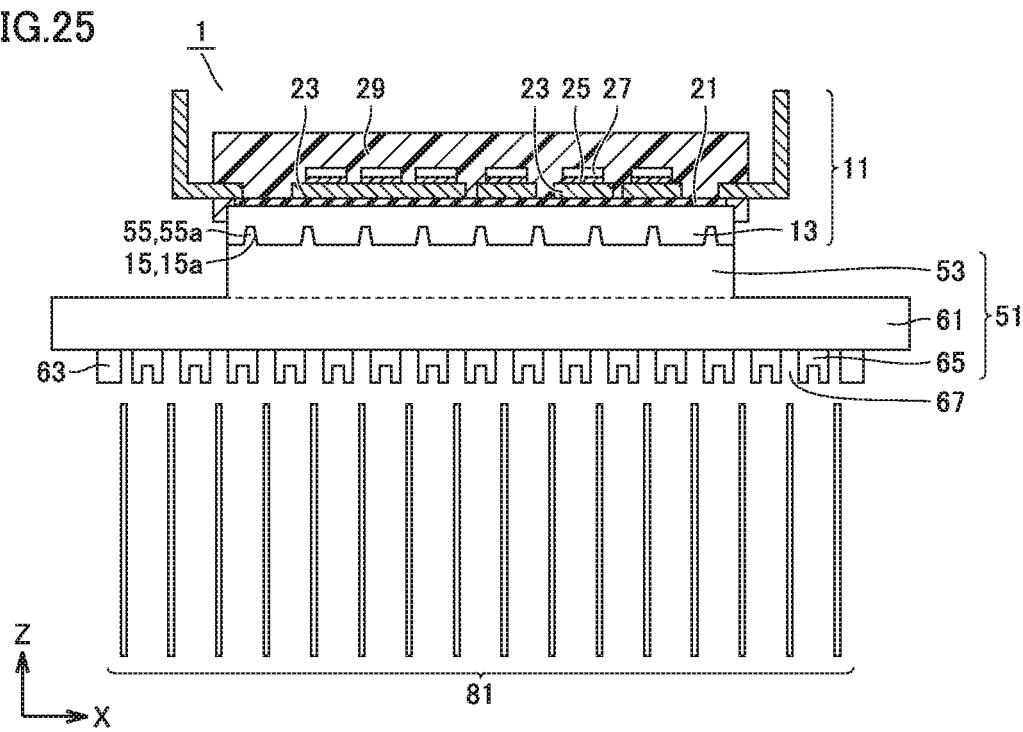
FIG. 25 is a second side view including a partial cross section for explaining the advantages of the semiconductor device in the above-mentioned embodiment.

Unlike the third comparative example, in the semiconductor device in the embodiment, fin base 51 includes heat radiation diffusion portion 61 and base portion 53. As shown in FIG. 24, the size of base portion 53 corresponds to the size of module base 13. This allows a shorter distance between the position (X direction) of second clamping jig 99b that holds base portion 53, and the position (X direction) of first clamping jig 99a that holds module base 13 of power module unit 11 to which pressure is applied. This can prevent fin base 51 from plastically deforming when the pressure is applied to power module unit 11.

There are three methods for integrating power module unit 11, fin base 51, and radiator fins 81 together. The first method is integrating power module unit 11 and fin base 51 together first, and then integrating radiator fins 81 and fin base 51 together. The second method is integrating radiator fins 81 and fin base 51 together first, and then integrating power module unit 11 and fin base 51 together. The third method is integrating power module unit 11, fin base 51, and radiator fins 81 together at the same time. Any of these methods can prevent fin base 51 from plastically deforming when pressure is applied to module base 13 of the power module unit.

In integrating power module unit 11 and fin base 51 together, the alignment is important between recess-projection portion 15 of module base 13 and recess-projection portion 55 of base portion 53. If recess-projection portion 15 and recess-projection portion 55 are misaligned, the following problems may occur. It may not be possible for projections 55a of base portion 53 to be inserted in recesses 15a of module base 13. Even if projections 55a are inserted in recesses 15a, a higher pressure is required to integrate power module unit 11 and fin base 51 together, which may cause a change in characteristics of chip 27. Further, chip 27 or power module unit 11 may be damaged.

In order to avoid such possible problems, power module unit 11 and fin base 51 are integrated together preferably while power module unit 11 (module base 13) is held by first clamping jig 99a and while fin base 51 (base portion 53) is held by second clamping jig 99b. Using first and second clamping jigs 99a and 99b, the alignment accuracy between power module unit 11 and fin base 51 is improved.

From this viewpoint, a deformation prevention portion 69 (see FIG. 55) and a support mechanism 95 (see FIG. 57) for preventing plastic deformation of the fin base, which are described later, should be designed so that module base 13 and fin base 51 can be held by the respective jig clamps.

When power module unit 11 is pressed toward fin base 51, caulking portions 65 in contact with press blades 97 are pushed out, so that respective radiator fins 81 are caulked. Thus, as shown in FIG. 18, power module unit 11 is joined to fin base 51, and a plurality of radiator fins 81 are integrally fitted on fin base 51. The semiconductor device as a power module integrated with a heat sink is thus completed.

In the above-described semiconductor device, power module unit 11 and fin base 51 are prepared as separate bodies, thus improving the productivity of the semiconductor device. The explanation for this fact is given below by comparison with a semiconductor device in a fourth comparative example.

Figure 26:
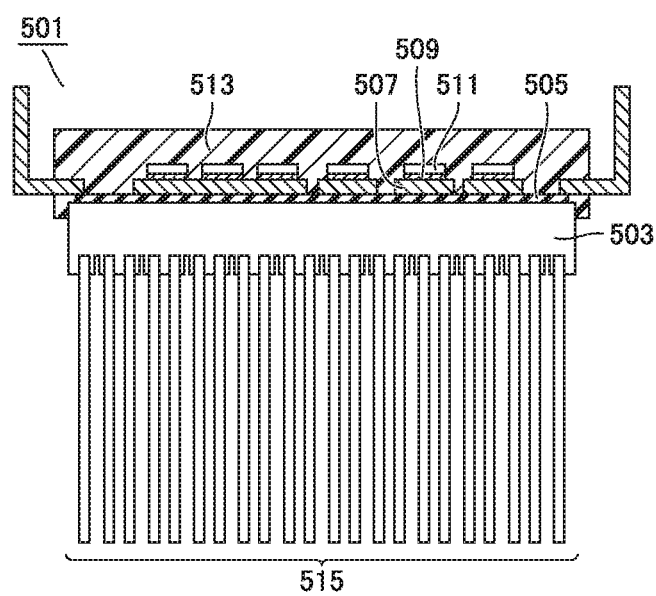
FIG. 26 is a side view including a partial cross section of a semiconductor device in a fourth comparative example.

As shown in FIG. 26, in a semiconductor device 501 in the fourth comparative example, a lead frame 507 is disposed on one surface of a base plate 503, with an insulating sheet 505 interposed therebetween. A chip 511 is joined to lead frame 507 via a solder 509. Chip 511 etc. is sealed with a mold resin 513. The other surface of base plate 503 is exposed and fitted with a plurality of radiator fins 515.

In semiconductor device 501, base plate 503 is mounted with chip 511 having a power semiconductor element tailored to the intended use. For example, if chip 511 mounted on semiconductor device 501 has a relatively large amount of heat generation, large-size radiator fins 515 are required so that the heat can be efficiently radiated. Increase in the number of radiator fins 515 is also required. On the other hand, if chip 511 mounted on semiconductor device 501 has a relatively small amount of heat generation, the size and the number of radiator fins 515 should be set accordingly.

Thus, semiconductor device 501 in the fourth comparative example requires base plate 503 tailored to the size, the number, etc. of radiator fins 515 to be fitted. Therefore, a molding die tailored to base plate 503 is required for sealing chip 511 etc. with mold resin 513. This causes reduction in productivity.

Unlike semiconductor device 501 in the fourth comparative example, in semiconductor device 1 in the embodiment, power module unit 11 and fin base 51 are prepared as separate bodies, and fin base 51 tailored to the heat density of power module unit 11 is joined to power module unit 11. Thus, common module base 13 can be used as module base 13 of power module unit 11.

Figure 27:
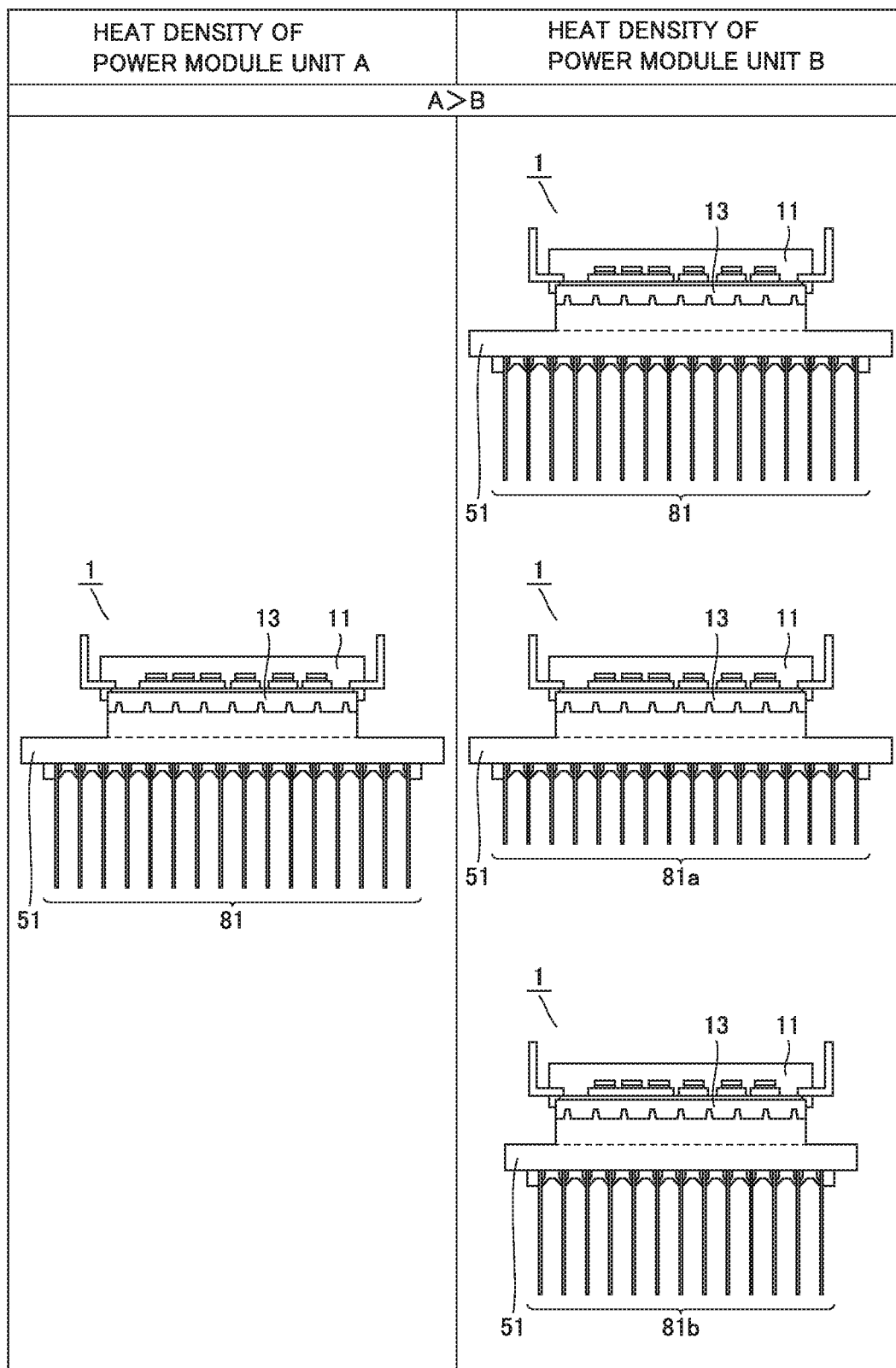
FIG. 27 is a diagram for explaining the advantages of the semiconductor device shown in FIG. 1 in the above-mentioned embodiment.

Here, as shown in FIG. 27, suppose two types of semiconductor devices 1 having different heat densities of the power module units (heat density A>heat density B). In this case, a common molding die can be used to seal the chip etc. with the mold resin, in spite of power module units 11 having different heat densities. Thus, the productivity of semiconductor device 1 is improved.

On the fin base 51 side, fin base 51 tailored to the heat density of power module unit 11 may be produced. For example, fin base 51 may be fitted with small-sized radiator fins 81*a* (see the middle in the right column in FIG. 27). Fin base 51 may be fitted with a smaller number of radiator fins 81*b* (see the bottom in the right column in FIG. 27). Semiconductor device 1 having heat density B may use a fin base fitted with radiator fins tailored to heat density A (see the top in the right column in FIG. 27). Thus, preparing power module unit 11 and fin base 51 as separate bodies allows wider range of variation in, for example, placement of radiator fins 81.

Figure 28:
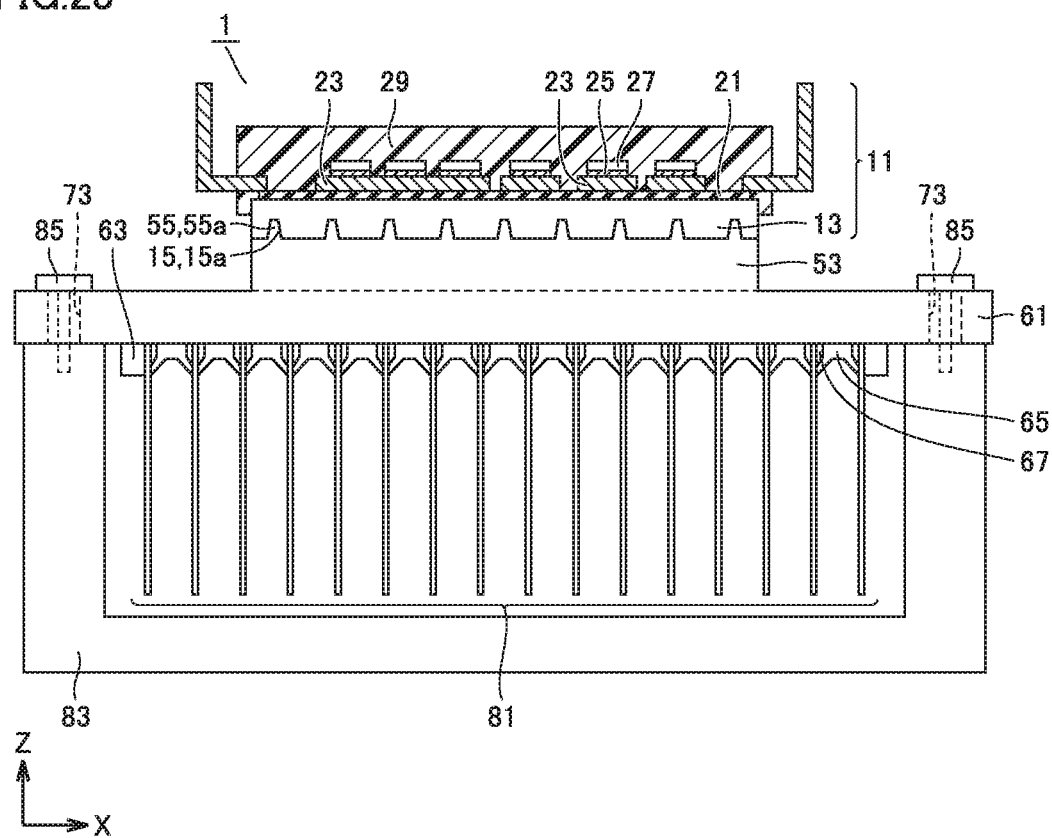
FIG. 28 is a side view including a partial cross section showing one example of a state in which the semiconductor device is fixed to a fixing chassis in the above-mentioned embodiment.

As shown in FIG. 10 and FIG. 15, in the above-described semiconductor device 1, holes 71 are formed at the four corners of heat radiation diffusion portion 61 of fin base 51. By inserting bolts 85 in respective holes 73, semiconductor device 1 can be fixed to a fixing chassis 83, as shown in FIG. 28. Heat radiation diffusion portion 61 of fin base 51 also serves as an air pathway.

Figure 29:
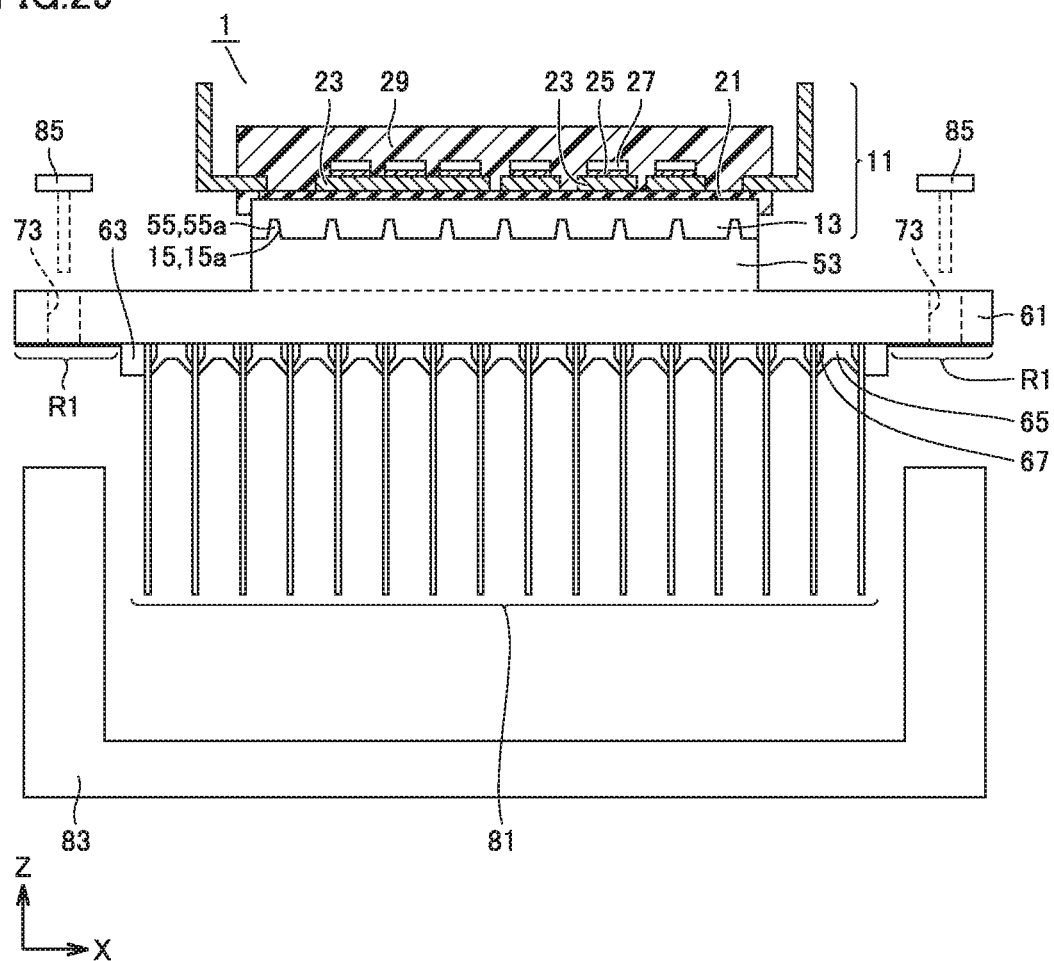
FIG. 29 is a first side view including a partial cross section for explaining a heat radiation diffusion portion in the semiconductor device in the above-mentioned embodiment.

In the semiconductor device in the embodiment, the peripheral part of heat radiation diffusion portion 61 has a region R1 where no caulking portion 65 or convex wall portion 63 is formed, at which to fix semiconductor device 1 to fixing chassis 83, as shown in FIG. 29. If an air pathway is provided, the peripheral part of heat radiation diffusion portion 61 has region R1 where no caulking portion 65 or convex wall portion 63 is formed.

Figure 30:
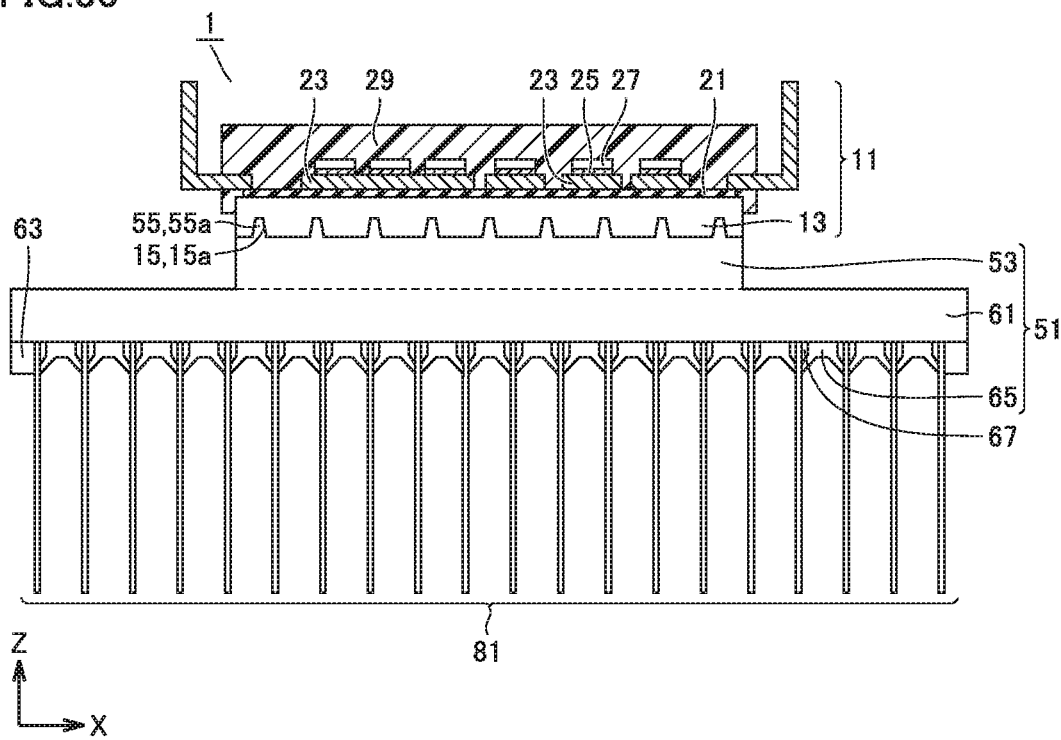
FIG. 30 is a second side view including a partial cross section for explaining the heat radiation diffusion portion in the semiconductor device in the above-mentioned embodiment.

As semiconductor device 1, however, heat radiation diffusion portion 61 does not necessarily have to include region R1 where no caulking portion 65 or convex wall portion 63 is formed. As shown in FIG. 30, caulking portions 65 and convex wall portions 63 may be formed at the peripheral part of heat radiation diffusion portion 61, and such a semiconductor device 1 can also bring about the above-described advantages.

From the foregoing, fin base 51 of semiconductor device 1 described above serves in the following ways, in addition to being joined to module base 13 of power module unit 11. Fin base 51 serves to conduct the heat generated at power module unit 11 through base portion 53 and heat radiation diffusion portion 61 to radiator fins 81, and to radiate the heat through radiator fins 81 to the outside. Further, fin base 51 serves to define an air pathway of radiator fins 81. Further, fin base 51 serves as a medium that fixes semiconductor device 1 to fixing chassis 83 with bolts 85 being inserted in holes 73.

Next, various variations of the semiconductor device in embodiment 1 are described. In the semiconductor device in each variation, the same members as those of the semiconductor device shown in FIG. 1 etc. are identically denoted, and the explanation thereof is not repeated unless required.

(First Variation)

As a semiconductor device in a first variation, one example variation of the pattern of the recess-projection portion formed on the base portion of the fin base is described.

Figure 31:
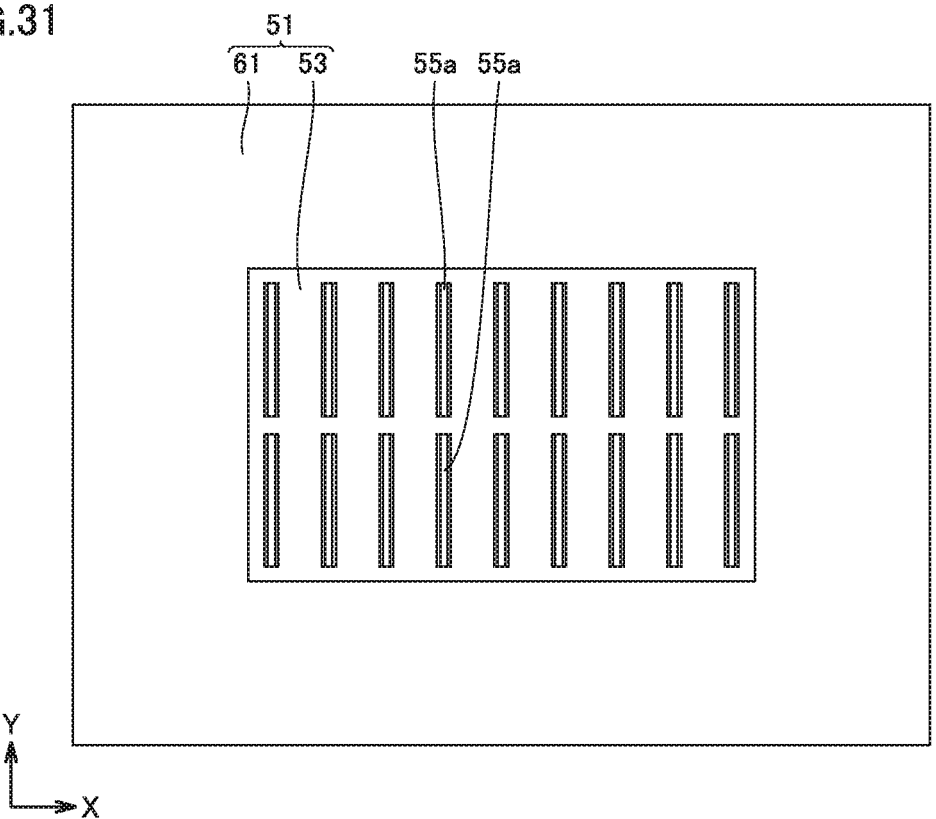
FIG. 31 is a top view of a fin base in a semiconductor device in a first variation of the above-mentioned embodiment.

In the above-described semiconductor device, recess-projection portion 55 formed on base portion 53 is formed in a pattern continuously extending along the Y-axis direction. However, recess-projection portion 55 is not necessarily limited to a continuously extending pattern. As shown in FIG. 31, each projection 55*a* formed on base portion 53 along the Y-axis direction may have a part where the projection is not formed. That is, each projection 55*a* of base portion 53 may have a discontinuous part.

If each projection 55*a* extending along the Y-axis direction has a part where the projection is not formed, the contact area between module base 13 (recesses 15*a*) and fin base 51 (projections 55*a*) is reduced. The reduction in contact area allows reduction in the press load when power module unit 11 is joined to fin base 51. Thus, damage to chip 27 etc. sealed with mold resin 29 is reduced. Discontinuous parts provided in recesses 15*a* of module base 13 (see FIG. 3) would also reduce the contact area and thus would be able to reduce the press load.

If, however, the contact area between module base 13 and fin base 51 is reduced too much, the contact thermal resistance will increase. Accordingly, the length of projections 55*a* of fin base 51 should be set based on the thermal design, so that a desired contact area between module base 13 and fin base 51 can be obtained.

In semiconductor device 1, as to the pattern of recess-projection portion 15 formed on module base 13 of power module unit 11, each recess 15*a* (see FIG. 3) formed along the Y-axis direction may have a discontinuous part where the recess is not formed, similar to recess-projection portion 55 of base portion 53 of fin base 51.

Figure 32:
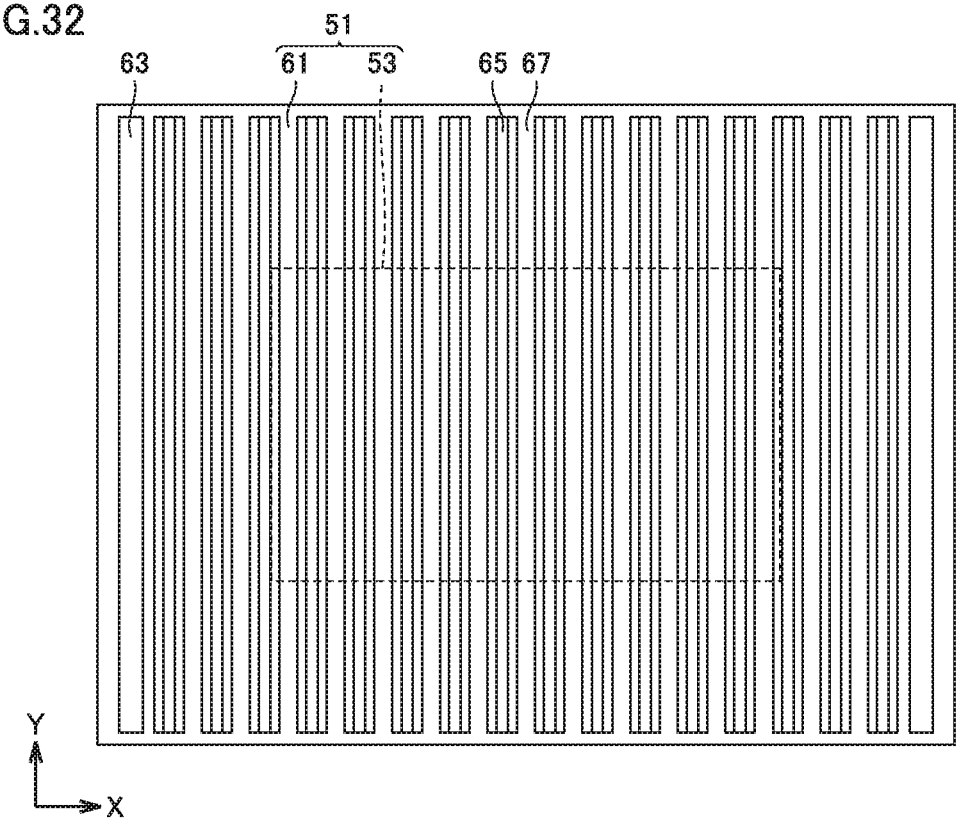
FIG. 32 is a bottom view of the fin base in the semiconductor device in the first variation of the above-mentioned embodiment.

Further, as to the pattern of caulking portions 65 (see FIG. 32) formed on heat radiation diffusion portion 61 of fin base 51, each caulking portion 65 formed along the Y-axis direction may have a part where the caulking portion is not formed.

The length of projections 55*a* of base portion 53 in the Y-axis direction, the length of recesses 15*a* of module base 13 in the Y-axis direction, and the length of caulking portions 65 of heat radiation diffusion portion 61 in the Y-axis direction each may be set to an appropriate length based on, for example, the thermal design. The effects related to the length of caulking portions 65 in the Y-axis direction will be described later.

(Second Variation)

As a semiconductor device in a second variation, one example variation of the pattern of the recess-projection portion formed on the module base etc. is described.

In the above-described semiconductor device 1 (see FIG. 1), recess-projection portion 15 formed on module base 13 is in a pattern continuously extending along the Y-axis direction. However, recess-projection portion 15 is not necessarily limited to a continuously extending pattern.

Figure 33:
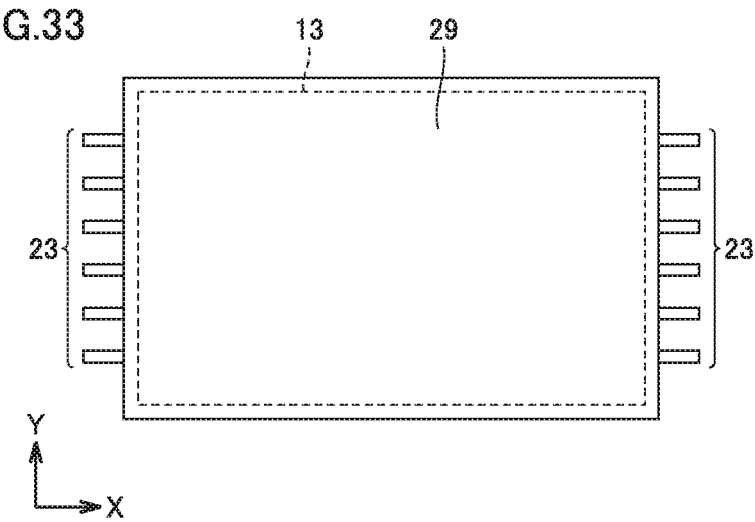
FIG. 33 is a top view of a power module unit in a semiconductor device in a second variation of the above-mentioned embodiment.
Figure 34:
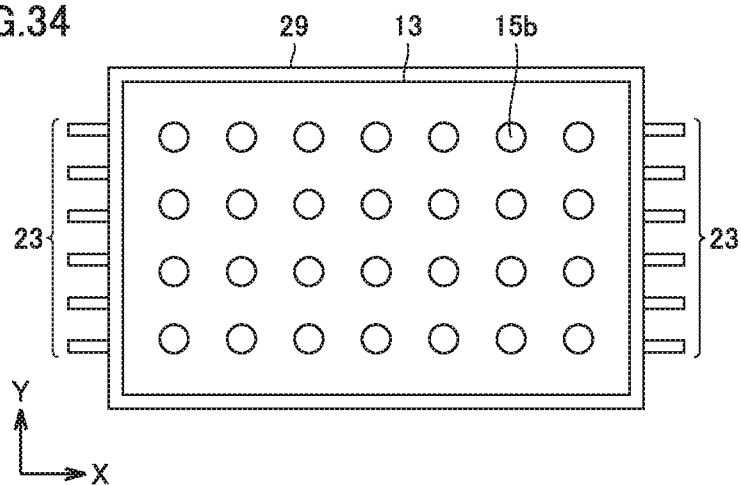
FIG. 34 is a bottom view of the power module unit in the semiconductor device in the second variation of the above-mentioned embodiment.
Figure 35:
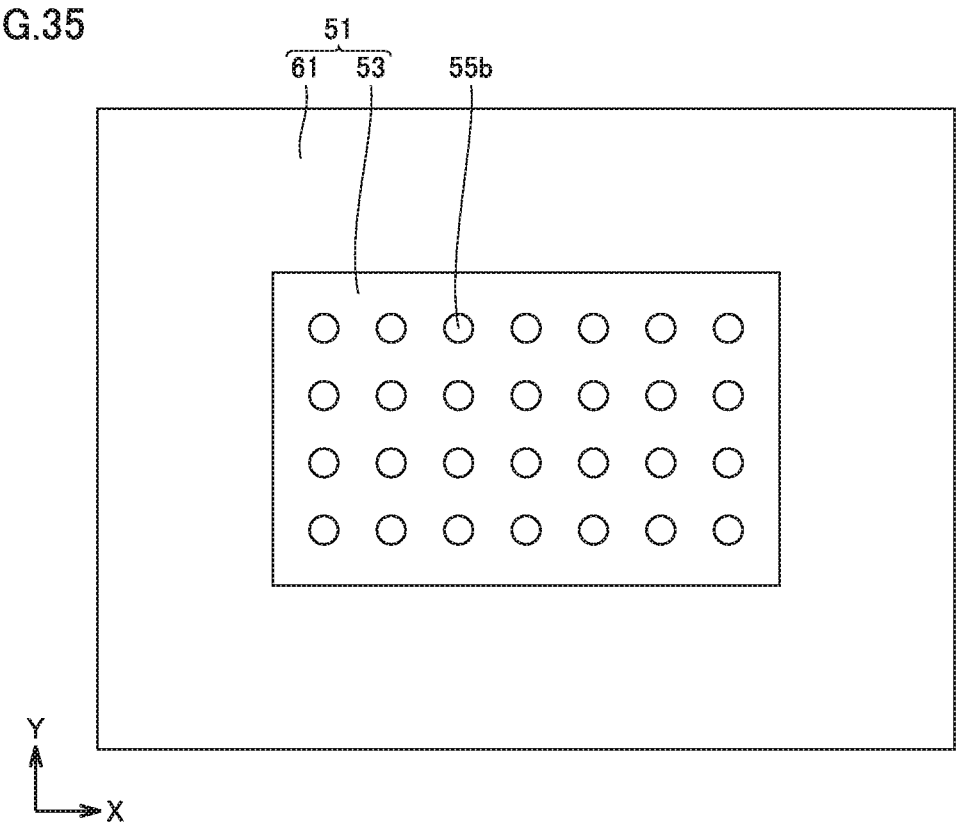
FIG. 35 is a top view of a fin base in the semiconductor device in the second variation of the above-mentioned embodiment.
Figure 36:
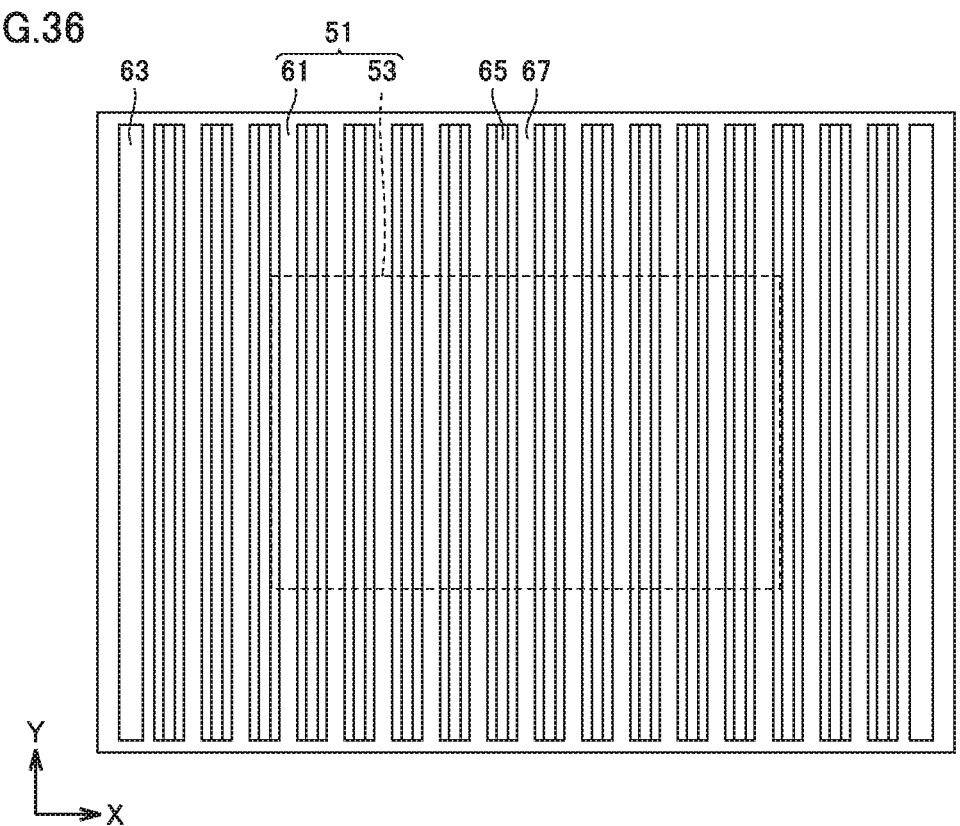
FIG. 36 is a bottom view of the fin base in the semiconductor device in the second variation of the above-mentioned embodiment.

As shown in FIG. 33 and FIG. 34, pin-shaped projections 15*b* may be formed on module base 13. In this case, as shown in FIG. 35 and FIG. 36, pin-shaped recesses 55*b* are formed on base portion 53 of fin base 51. Power module unit 11 can be joined to fin base 51 by fitting pin-shaped projections 15*b* of module base 13 into pin-shaped recesses 55*b* of base portion 53. This brings about the same advantages as those of the above-described semiconductor device 1 (see FIG. 1).

(Third Variation)

As a semiconductor device in a third variation, one example variation of the heat radiation diffusion portion is described.

Figure 37:
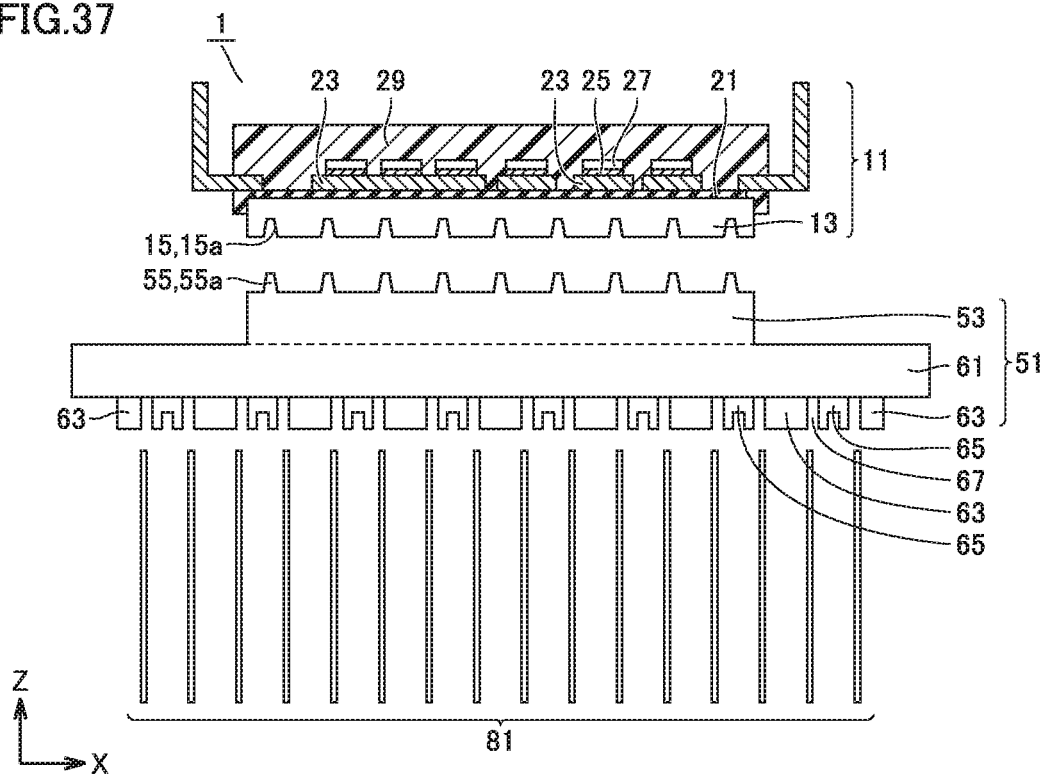
FIG. 37 is an exploded side view including a partial cross section of a semiconductor device in a third variation of the above-mentioned embodiment.

FIG. 37 shows an exploded side view including a partial cross section of semiconductor device 1. As shown in FIG. 37, in semiconductor device 1 in the third variation, caulking portions 65 and convex wall portions 63 are alternately disposed on heat radiation diffusion portion 61.

Figure 38:
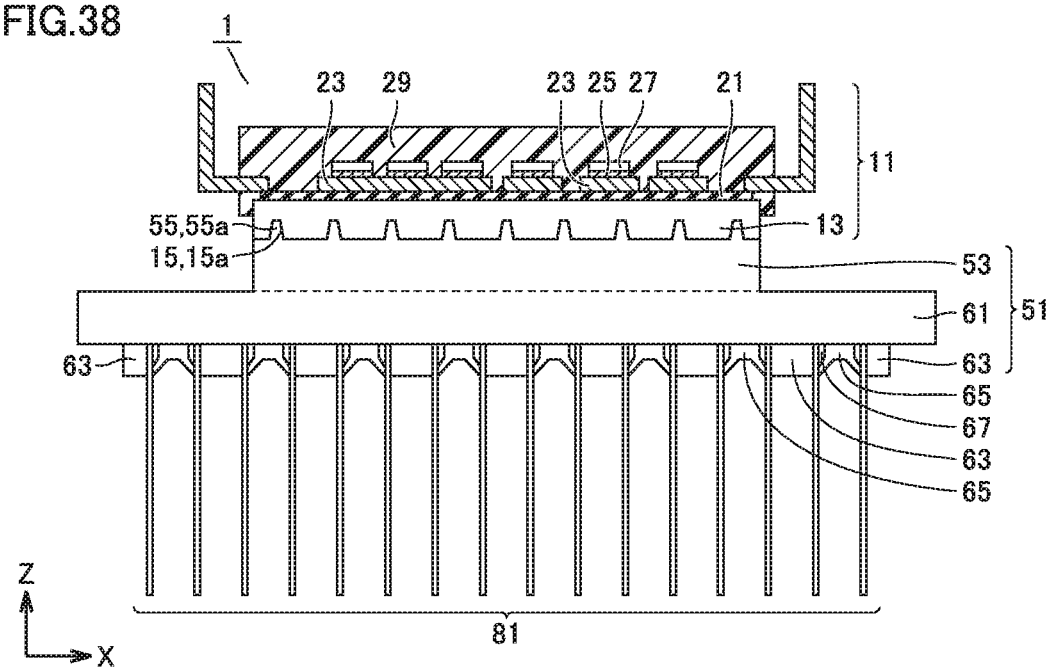
FIG. 38 is a side view including a partial cross section, showing one process in a method for manufacturing a semiconductor device in a third variation of the above-mentioned embodiment.

As shown in FIG. 38, when caulking portions 65 are caulked, pressure (press load) is applied from above while radiator fins 81 are inserted in fin insertion grooves 67, so that caulking portions 65 are plastically deformed by press blades 97. Thus, radiator fins 81 are integrally fitted on heat radiation diffusion portion 61.

Semiconductor device 1 in the third variation requires a lower press load to caulk a plurality of radiator fins 81 than the above-described semiconductor device 1 (see FIG. 1), under the condition that the number of radiator fins 81 fitted on semiconductor device 1 in the third variation is the same as that of semiconductor device 1 shown in FIG. 1.

The number of caulking portions 65 in the semiconductor device shown in FIG. 37 is half of the number of caulking portions 65 in semiconductor device 1 shown in FIG. 1. By reducing the number of caulking portions to be plastically deformed by half, the press load required to caulk the caulking portions is reduced by half.

This prevents mold resin 29 from being damaged (e.g. broken) by the press load applied to caulk caulking portions 65. This can also significantly reduce defects, such as a change in characteristics, of chip 27 that would be caused by the press load.

In particular, if joining power module unit 11 to fin base 51 and fitting radiator fins 81 to fin base 51 are performed with a single press, a larger press load is required. On the other hand, if joining power module unit 11 to fin base 51 and fitting radiator fins 81 to fin base 51 are performed separately, press load will be applied to power module unit 11 (chip 27) twice. In order to make the characteristics less affected by the press load applied to chip 27 sealed with mold resin 29, minimizing the press load is important.

(Fourth Variation)

As a semiconductor device in a fourth variation, another example variation of the pattern of the recess-projection portion formed on the module base is described.

In the above-described semiconductor device 1 (see FIG. 1), recesses 15a are formed on module base 13, and projections 55a are formed on base portion 53. However, this is not limitative.

Figure 39:
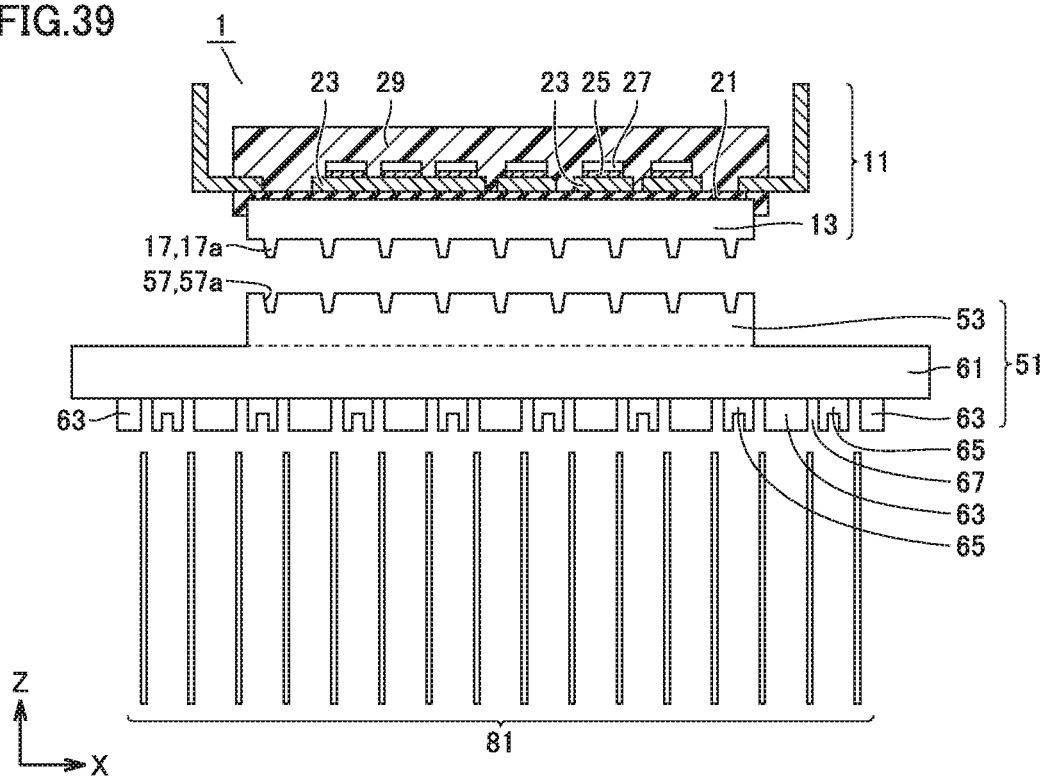
FIG. 39 is an exploded side view including a partial cross section of a semiconductor device in a fourth variation of the above-mentioned embodiment.

As shown in FIG. 39, projections 17a (recess-projection portion 17) may be formed on module base 13, and recesses 57a (recess-projection portion 57) may be formed on base portion 53. Which of module base 13 and base portion 53 (fin base 51) has the projections (or the recesses) is determined preferably based on which of module base 13 and base portion 53 is to be plastically deformed for joining. Specifically, it is determined preferably based on the hardness of the material that constitutes module base 13 and based on the hardness of the material that constitutes fin base 51.

If the recesses are plastically deformed by the projections for joining power module unit 11 to fin base 51, for example, the material for the member with the projections is made harder than the material for the member with the recesses. Thus, the joining can be achieved with a lower press load.

(Fifth Variation)

As a semiconductor device in a fifth variation, still another example variation of the pattern of the recess-projection portion formed on the module base etc. is described.

In the above-described semiconductor device 1 (see FIG. 1 or FIG. 39), projections 17a (projections 55a) formed on module base 13 (base portion 53) all have the same height. Also, recesses 57a (recesses 15a) formed on base portion 53 (module base 13) all have the same depth.

However, it is not necessary that all of projections 17a (projections 55a) have the same height. Some projections 17a (projections 55a) may be higher than the other projections 17a (projections 55a). Also, it is not necessary that all of recesses 57a (recesses 15a) have the same depth. Some recesses 57a (recesses 15a) may be deeper than the other recesses 57a (recesses 15a).

Figure 40:
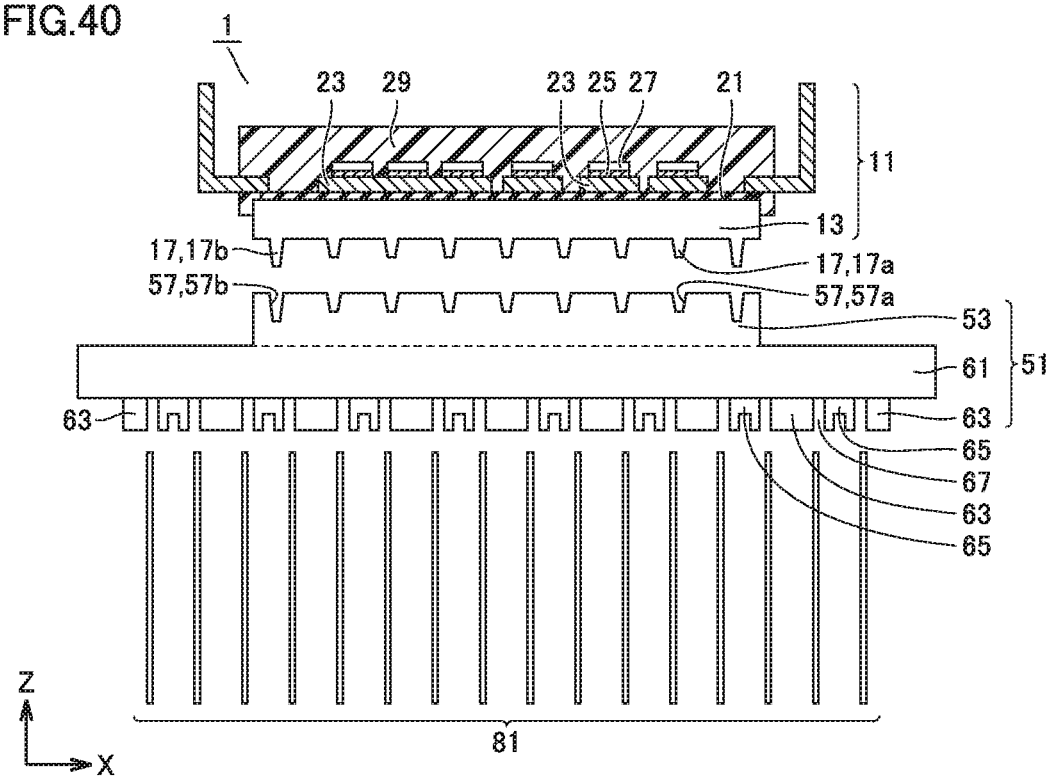
FIG. 40 is an exploded side view including a partial cross section of a semiconductor device in a fifth variation of the above-mentioned embodiment.

For example, as shown in FIG. 40, projections 17b located at both ends may be higher than the other projections 17a. Also, recesses 57b located at both ends, corresponding to those projections 17b, may be deeper than the other recesses 57a.

When power module unit 11 is joined to fin base 51, projections 17b, which are located at both ends and are relatively high, will be fitted into recesses 57b in advance of the other projections 17a. This allows easy alignment between power module unit 11 and fin base 51 in the horizontal direction. As a result, power module unit 11 can be joined to fin base 51, with module base 13 and fin base 51 not inclining relative to each other.

If module base 13 and fin base 51 incline relative to each other, the length by which radiator fins 81 are in contact with caulking portions 65 and the length by which radiator fins 81 are in contact with convex wall portions 63 are shorter in some places when caulking portions 65 are caulked onto radiator fins 81 in fin insertion grooves 67. This may reduce the holding strength in the insertion direction (vertical) of the radiator fins. Further, a possible increase in contact thermal resistance may degrade the heat radiation performance of fin base 51, radiator fins 81, and the like as a heat sink.

In semiconductor device 1 in the fifth variation, power module unit 11 can be joined to fin base 51, with module base 13 and fin base 51 not inclining relative to each other. Thus, the possible problems described above are avoided.

In semiconductor device 1 in the second variation shown in FIG. 33 to FIG. 36, some of a plurality of pin-shaped projections 55b may be made higher than the other pin-shaped projections 55b. Also, some of a plurality of pin-shaped recesses 15b may be deeper than the other recesses 15b. In this case, the same advantages as those described above can be obtained.

(Sixth Variation)

As a semiconductor device in a sixth variation, one example variation of the placement of the radiator fins is described.

In the above-described semiconductor device 1 (see FIG. 1), both recess-projection portion 55 of base portion 53 in fin base 51 and caulking portions 65 on heat radiation diffusion portion 61 extend along the Y-axis direction. However, recess-projection portion 55 and caulking portions 65 do not necessarily have to extend in the same direction.

Figure 41:
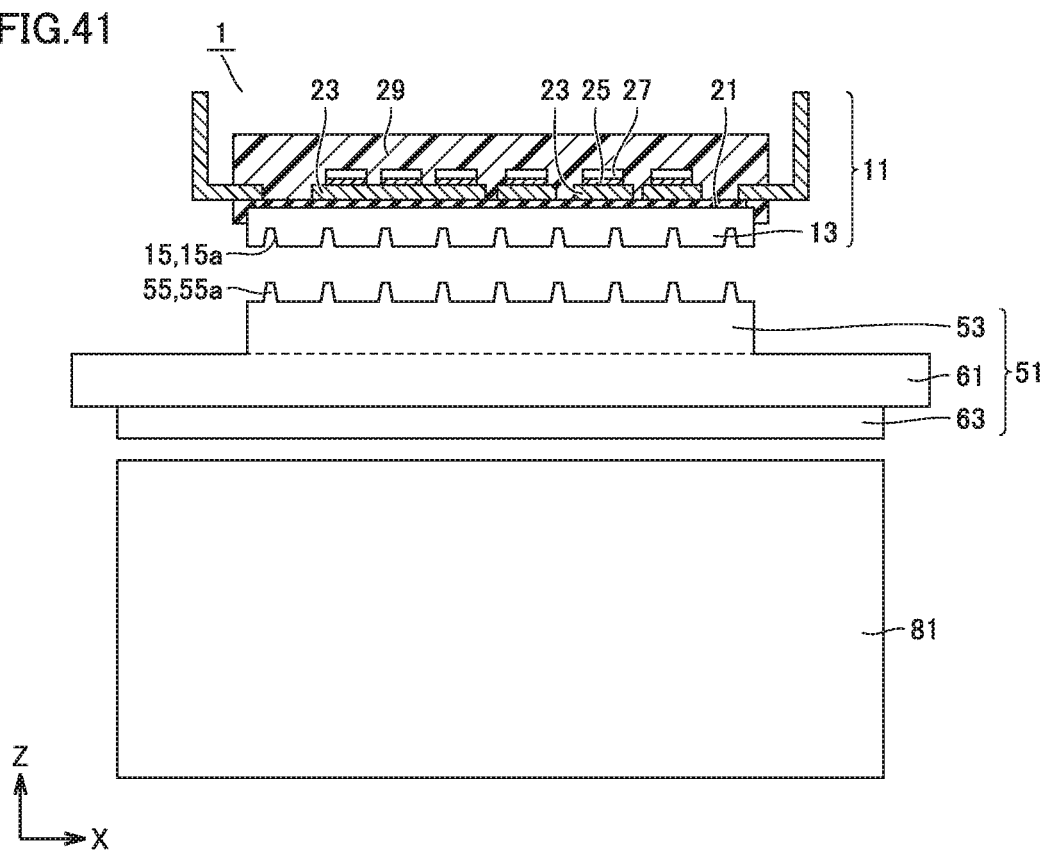
FIG. 41 is an exploded side view including a partial cross section of a semiconductor device in a sixth variation of the above-mentioned embodiment.
Figure 42:
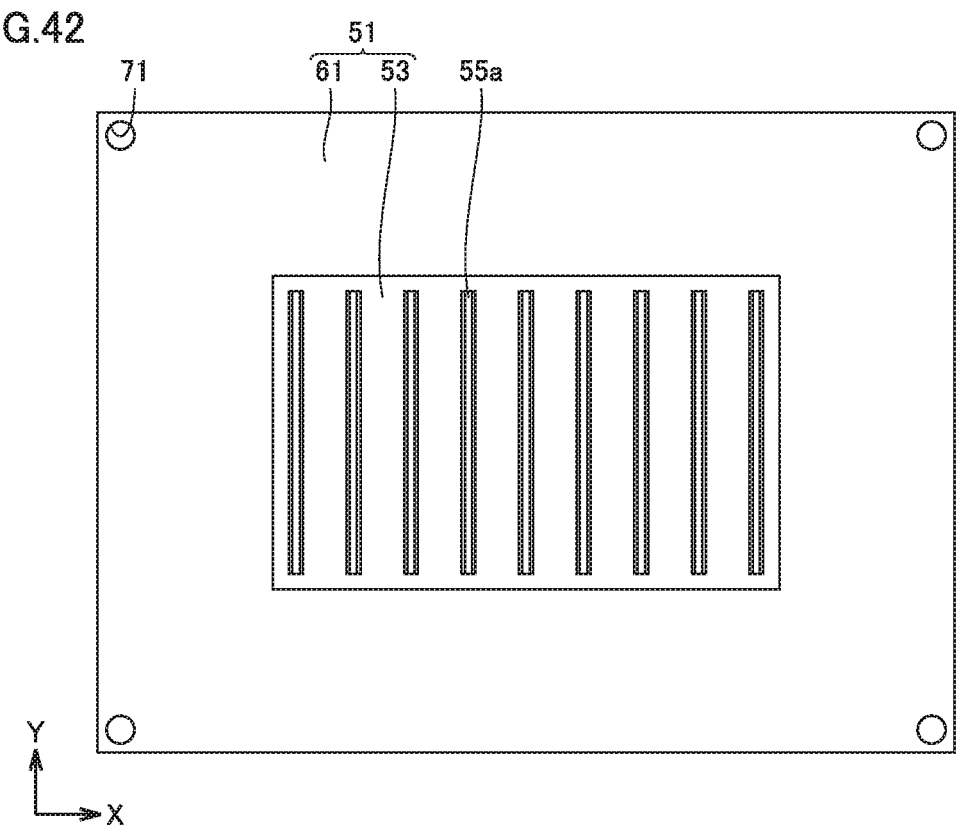
FIG. 42 is a top view of a fin base in the semiconductor device in the sixth variation of the above-mentioned embodiment.
Figure 43:
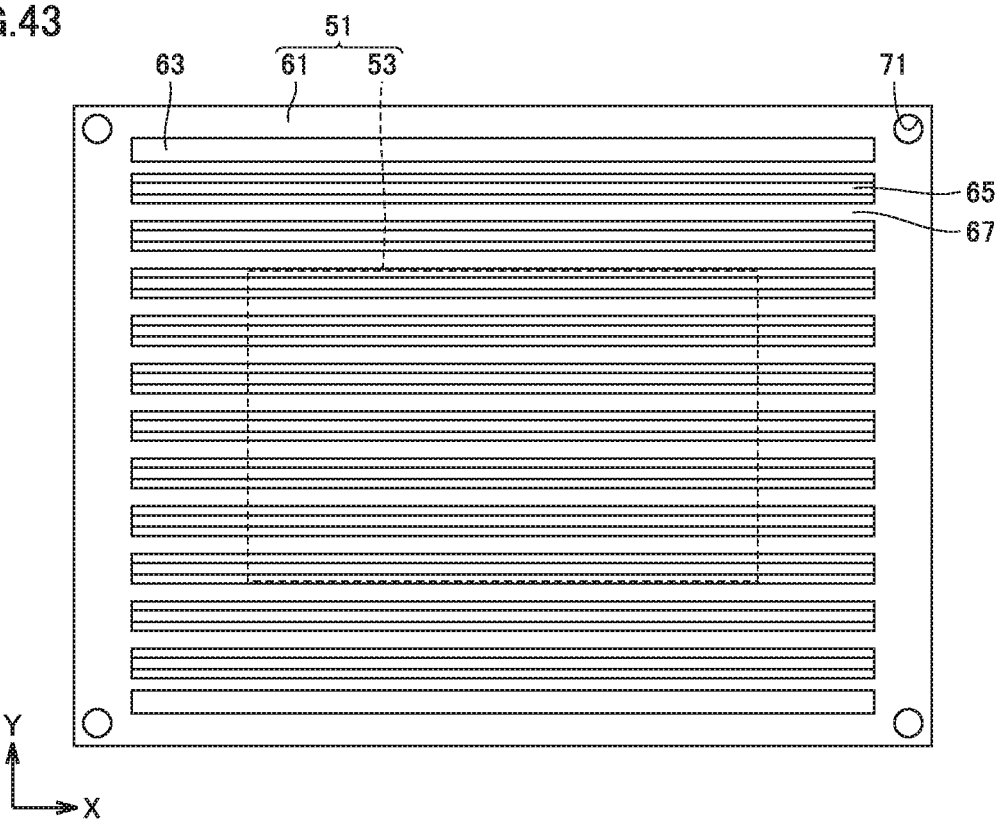
FIG. 43 is a bottom view of the fin base in the semiconductor device in the sixth variation of the above-mentioned embodiment.

For example, as shown in FIG. 41, FIG. 42, and FIG. 43, recess-projection portion 55 of base portion 53 may extend along the Y-axis direction, and caulking portions 65 may extend along the X-axis direction.

The size of the fixing chassis is specified for a device (not shown) to which semiconductor device 1 is applied. The size of the radiator fins of the semiconductor device to be placed in the chassis is restricted by the size of the fixing chassis. Accordingly, in a structure in which recess-projection portion 55 of base portion 53 and caulking portions 65 of heat radiation diffusion portion 61 extend in the same direction, it may not be possible to place radiator fins 81 in the fixing chassis.

In such a case, in semiconductor device 1 in the fifth variation, the direction in which caulking portions 65 extend intersects the direction in which recess-projection portion 55 extends. This may allow the radiator fins to be placed in the fixing chassis.

(Seventh Variation)

As a semiconductor device in a seventh variation, one example variation of the fin base is described.

Figure 44:
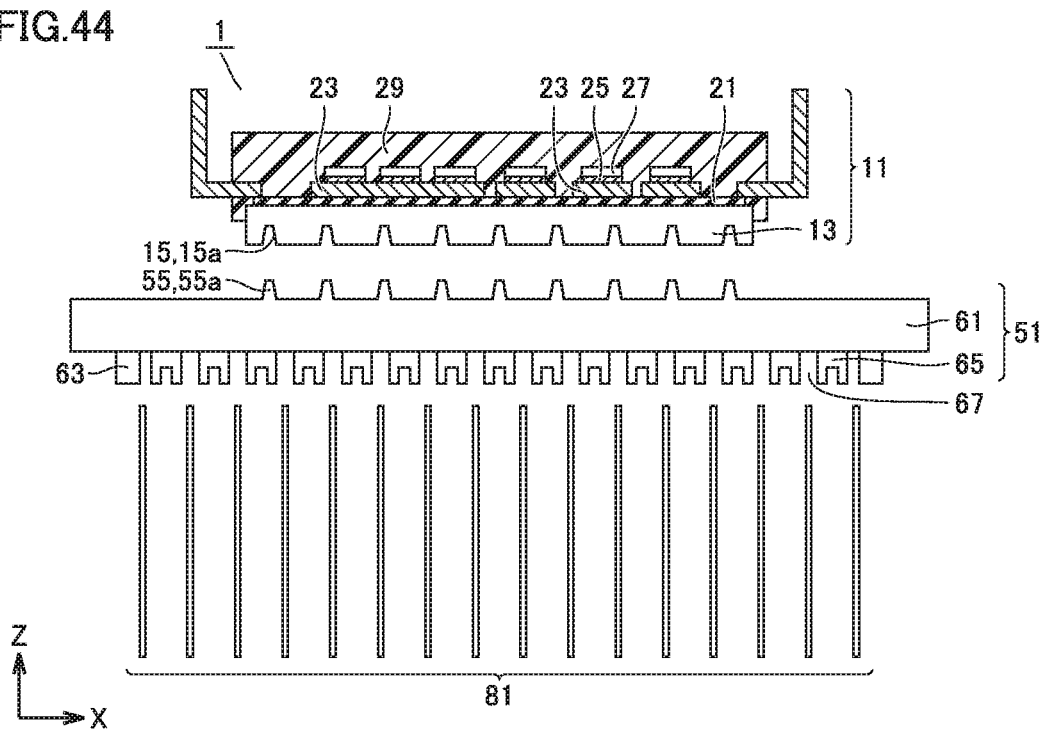
FIG. 44 is an exploded side view including a partial cross section of a semiconductor device in a seventh variation of the above-mentioned embodiment.

As shown in FIG. 44, heat radiation diffusion portion 61 of fin base 51 may only have projections 55a. In this case, heat radiation diffusion portion 61 preferably has such a thickness that does not deform when power module unit 11 is joined to fin base 51, for example.

Next, the materials for module base 13, fin base 51, etc. (see, for example, FIG. 1) applied to the above-described semiconductor device 1 (including semiconductor device 1 of each variation) are described. Module base 13 and fin base 51 are formed by, for example, machining, die casting, forging, and extruding. As the material for module base 13 and fin base 51, aluminum or aluminum alloy is applied.

As the material for radiator fins 81, aluminum, aluminum alloy, or the like is applied. Radiator fins 81, which are formed as plates, have both good workability and heat radiation performance. The surfaces of radiator fins 81 are embossed, so that minute dents are formed on the surfaces. This increases the surface area of radiator fins 81 and thus improves the heat radiation performance. The embossing may be performed by sharing the die for pressing the radiator fins. Accordingly, the embossing can be performed without increasing the production cost.

The minute embossing on the surfaces of radiator fins 81 can reduce the contact area between radiator fins 81 when radiator fins 81 are stacked. When radiator fins 81 are fitted on heat radiation diffusion portion 61, a plurality of stacked radiator fins 81 are taken out one by one, and the taken-out radiator fins 81 are inserted into fin insertion grooves 67.

Reduction in contact area between stacked radiator fins 81 allows reduction in the surface friction between radiator fins 81, thus making it easy to take out radiator fins 81. This can simplify the production facilities and shorten the time required for the production, thus improving the productivity.

Further, due to the minute embossing on the surfaces of radiator fins 81, when caulking portions 65 are caulked for radiator fins 81 to be fitted on heat radiation diffusion portion 61, caulking portions 65 enter radiator fins 81 deeper at the area where minute dents are formed than at the area where no dent is formed. This produces an anchor effect which prevents the radiator fins from being pulled out of caulking portions 65. That is, the friction in the insertion direction of radiator fins 81 is increased, thus improving the tensile strength in the insertion direction (vertical direction) of radiator fins 81.

If radiator fins 81 are harder than fin base 51 in particular, caulking portions 65 fitted with radiator fins 81 plastically deform along the surfaces of radiator fins 81, rather than digging into the surfaces of radiator fins 81. Thus, the tensile strength in the insertion direction of radiator fins 81 is improved.

On the other hand, if fin base 51 is harder than radiator fins 81, caulking portions 65 fitted with radiator fins 81 dig into the surfaces of radiator fins 81, causing radiator fins 81 to plastically deform. Thus, an anchor effect is produced by the plastically deformed caulking portions 65 and radiator fins 81. Therefore, if fin base 51 is harder than radiator fins 81, the embossing of the surfaces of radiator fins 81 will be less effective.

Thus, from the viewpoint of the strength of radiator fins 81 fitted on fin base 51, it is preferable that the surfaces of radiator fins 81 be embossed so that minute dents are formed thereon (requirement A), or that fin base 51 and radiator fins 81 be made of different materials, where fin base 51 is harder than radiator fins 81 (requirement B). Satisfying at least one of requirement A and requirement B can improve the tensile strength in the insertion direction of radiator fins 81 fitted on fin base 51.

The inventors evaluated the tensile strength in the insertion direction (vertical direction) of radiator fins 81 fitted on fin base 51. The evaluation is described. Specifically, the evaluation was made under the condition that fin base 51 was made of aluminum 6000 series and that radiator fins 81 were made of aluminum 1000 series (condition A). Also, the evaluation was made, as a comparative example, under the condition that fin base 51 and radiator fins 81 were both made of aluminum 1000 series.

Figure 45:
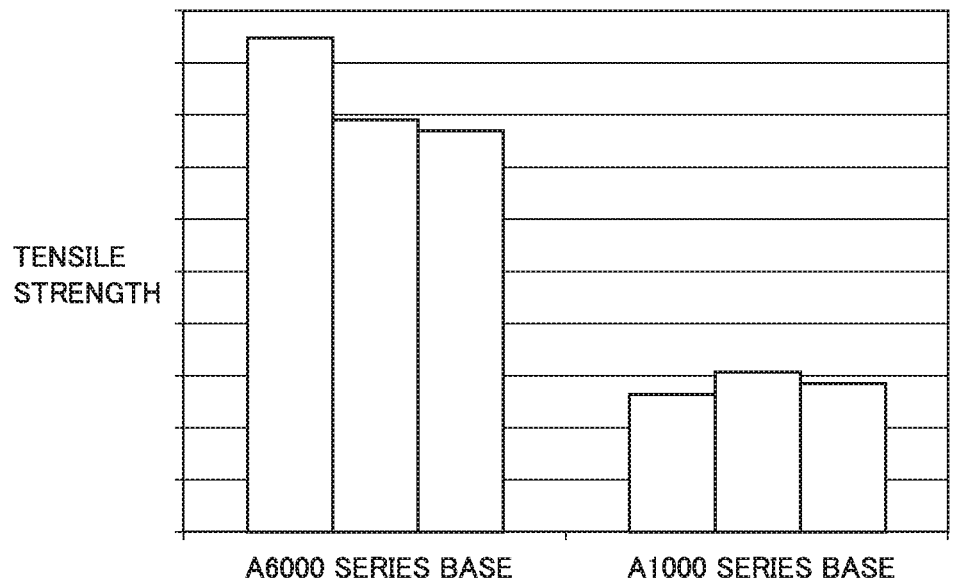
FIG. 45 is a diagram showing the relation between the material for the fin base and radiator fins, and the tensile strength in the above-mentioned embodiment.

The results are shown in FIG. 45. The A6000 series base shown in FIG. 45 is the result under condition A. The A1000 series base is the result under condition B (comparative example). For each of condition A and condition B, three radiator fins were evaluated. As shown in FIG. 45, it was found that the tensile strength under condition A was about 2.5 to 3.6 times higher than the tensile strength under condition B (comparative example).

The material for module base 13, fin base 51, and radiator fins 81 is not limited to aluminum or aluminum alloy. For example, from the viewpoint of heat radiation, radiator fins made of copper-based plates, which have higher heat conductivity than aluminum-based material, can further improve the heat radiation performance than radiator fins made of aluminum-based material.

In the above-described semiconductor device, radiator fins 81 are integrally fitted on heat radiation diffusion portion 61 by inserting radiator fins 81 into fin insertion grooves 67 and caulking the caulking portions 65. In such a caulked heat sink where radiator fins 81 and fin base 51 are integrated together by caulking, the aspect ratio can be freely designed (set), unlike die casting or extruding where the aspect ratio restricts the working. As a result, the heat radiation performance of the heat sink is improved.

Here, suppose a heat sink in which radiator fins 81 have a thickness of 0.6 to 1.0 mm, fin insertion grooves 67 of fin base 51 have a width of 0.8 to 1.2 mm, and radiator fins 81 have a pitch of 3 to 5 mm, for example. It is thought that such a heat sink is nearly impossible to form by die casting and extruding.

However, such a heat sink can be formed by preparing a fin base and radiator fins as separate bodies and then integrating them by caulking. Note that the above-described numerical values of the thickness, the width, and the pitch are by way of example and not by way of limitation. The numerical values may be set as appropriate depending on the application purpose.

By evaluating the relation between the surface roughness of each of module base 13 and fin base 51 and the contact thermal resistance, the inventors confirmed that a surface roughness (Ra) of about 0.5 a very smooth surface, allows reduction in the contact thermal resistance. Surface roughness (Ra) is the arithmetic mean roughness.

As to the surface roughness of radiator fins 81, it was found that, by using a rolled steel material, surface roughness (Ra) of about 0.3 µm can be achieved without increasing the production cost. The inventors confirmed that a lower surface roughness provides a better heat radiation performance.

Embodiment 2

Figure 46:
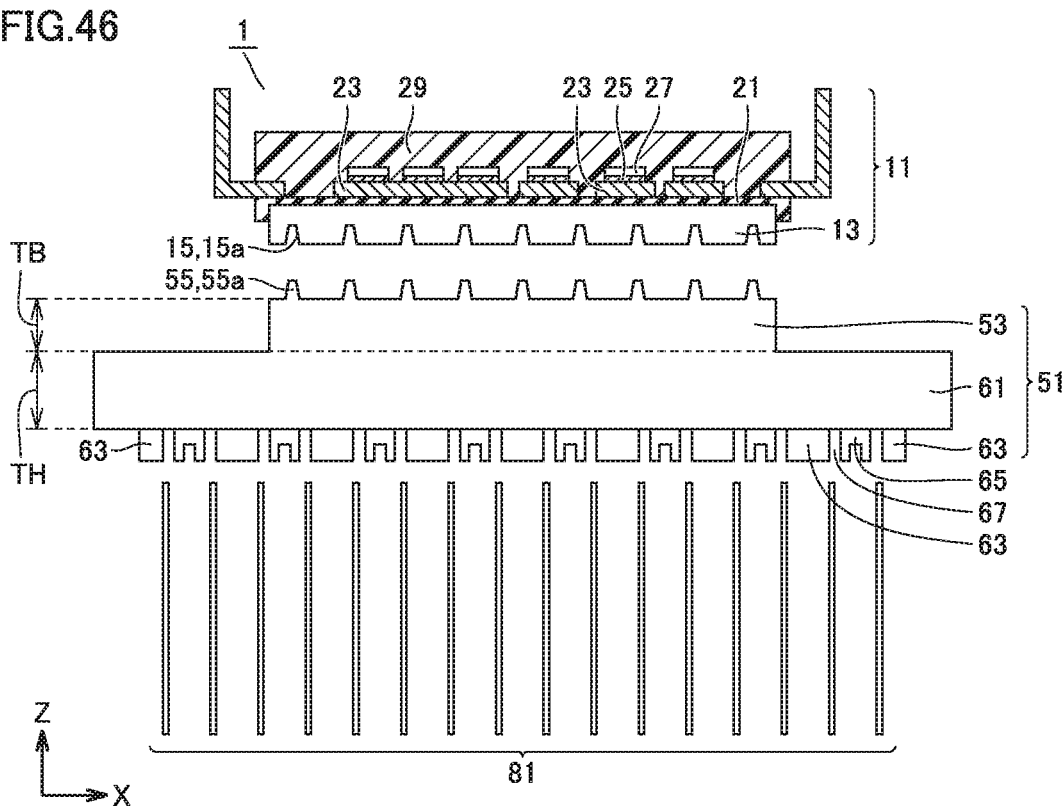
FIG. 46 is an exploded side view including a partial cross section of a semiconductor device in embodiment 2.

A semiconductor device in embodiment 2 is described. FIG. 46 shows an exploded side view including a partial cross section of the semiconductor device. As shown in FIG. 46, semiconductor device 1 includes power module unit 11, fin base 51, and a plurality of radiator fins 81.

In fin base 51, thickness TH of heat radiation diffusion portion 61 is larger than thickness TB of base portion 53. In the other respects, the semiconductor device is the same as the semiconductor device shown in FIG. 1 etc. Thus, the same members are identically denoted, and the explanation thereof is not repeated unless required.

Figure 47:
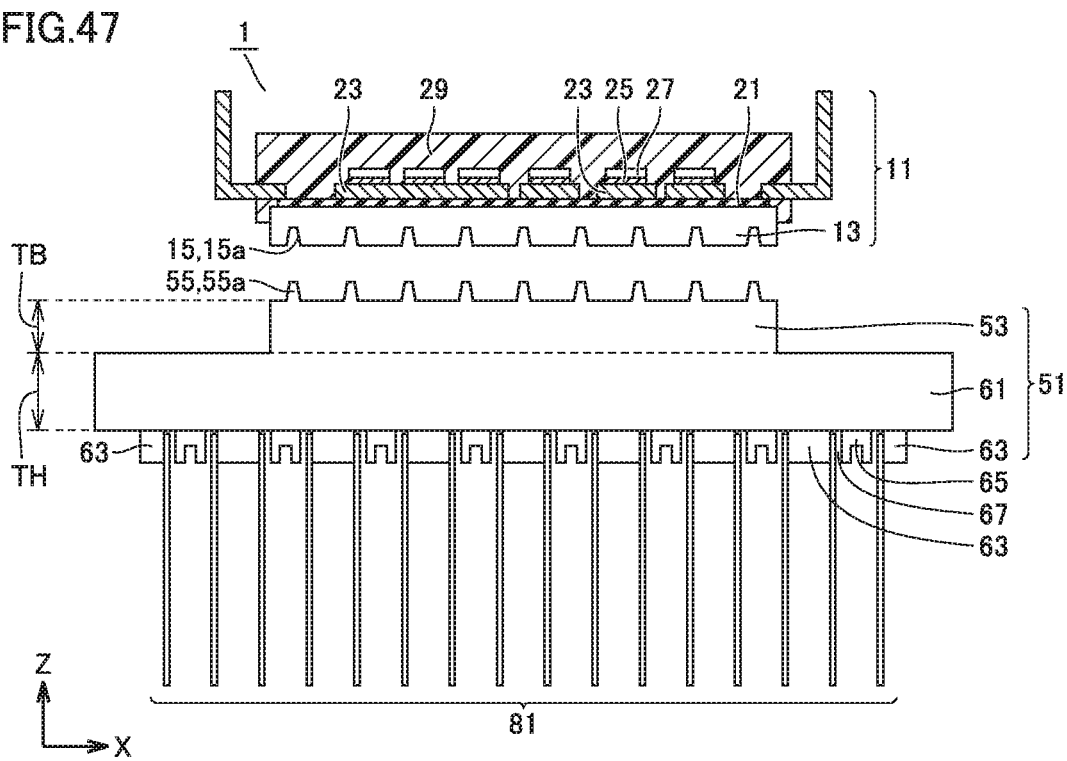
FIG. 47 is a side view including a partial cross section, showing one process in a method for manufacturing a semiconductor device in the above-mentioned embodiment.

Next, one example of a method for manufacturing the above-described semiconductor device is described. As shown in FIG. 47, power module unit 11 is formed by the same process as the process shown in shown in FIG. 16. Fin base 51 and radiator fins 81 are prepared. Power module unit 11 and fin base 51 are arranged so that recess-projection portion 15 of module base 13 faces recess-projection portion 55 of the base portion. Further, radiator fins 81 are inserted in respective fin insertion grooves 67 in heat radiation diffusion portion 61 of fin base 51.

Figure 48:
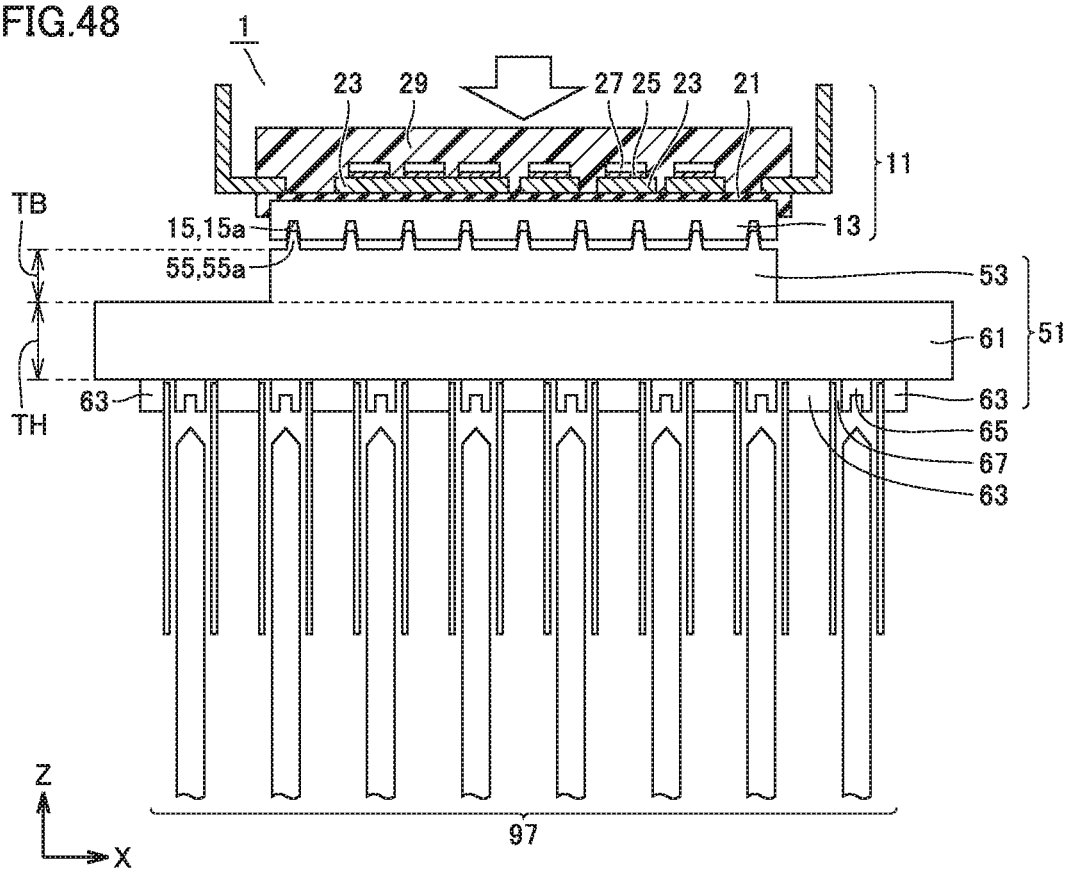
FIG. 48 is a side view including a partial cross section showing a process to be performed after the process shown in FIG. 47 in the above-mentioned embodiment.

Next, as shown in FIG. 48, press blades 97 are each inserted between radiator fin 81 and radiator fin 81 of a plurality of radiator fins 81 and each come into contact with caulking portion 65. Next, power module unit 11 is pressed from above (see the arrow).

Figure 49:
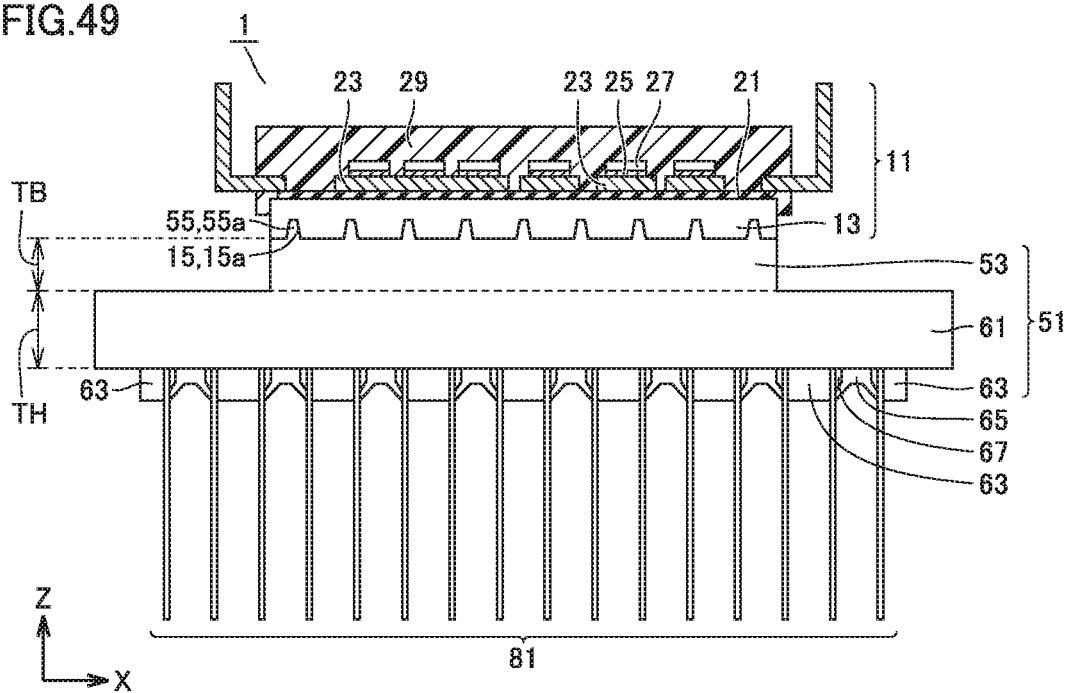
FIG. 49 is a side view including a partial cross section showing a process to be performed after the process shown in FIG. 48 in the above-mentioned embodiment.

When pressure (press load) is applied to power module unit 11, recess-projection portion 15 (recesses 15a) of power module unit 11 are fitted to recess-projection portion 55 (projections 55a) of base portion 53 of fin base 51, as shown in FIG. 49. Thus, power module unit 11 is joined to fin base 51. When power module unit 11 is pressed toward fin base 51, caulking portions 65 in contact with press blades 97 are pushed out, so that respective radiator fins 81 are caulked.

Thus, power module unit 11 is joined to fin base 51, and a plurality of radiator fins 81 are integrally fitted on fin base 51. The semiconductor device as a power module is thus completed.

In the above-described semiconductor device, thickness TH of heat radiation diffusion portion 61 is larger than thickness TB of base portion 53. This can prevent heat radiation diffusion portion 61 from deforming when the press load is applied. The explanation for this fact is given below.

Figure 50:
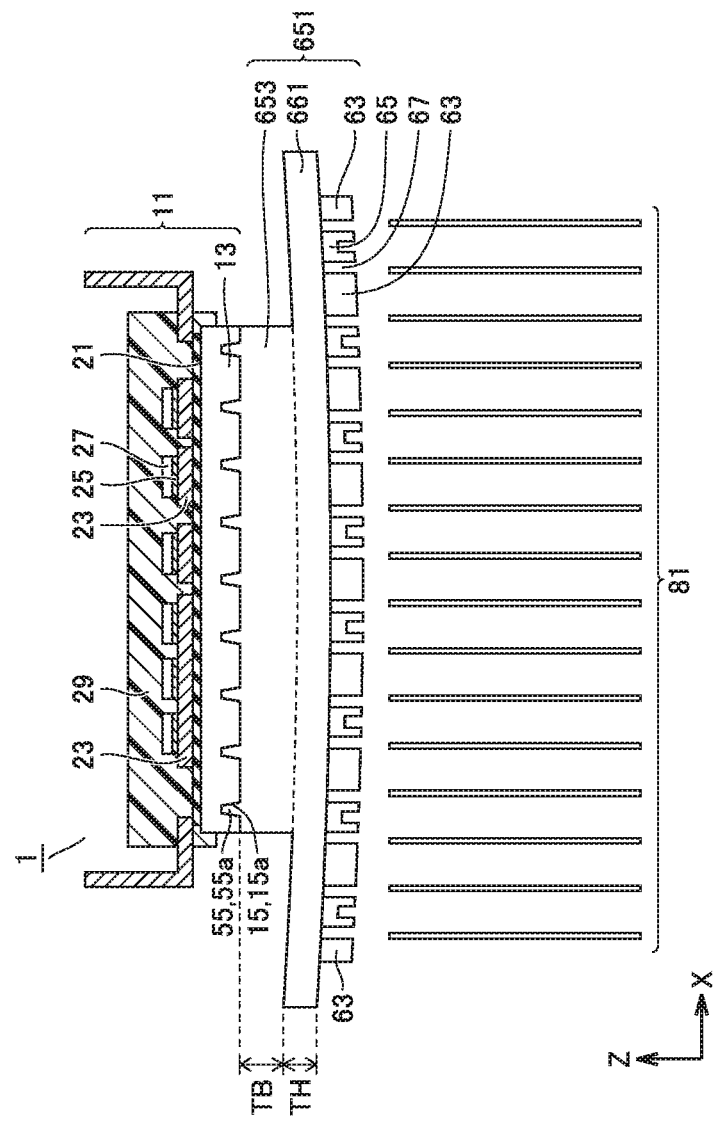
FIG. 50 is an exploded side view including a partial cross section, for explaining the problems of a semiconductor device in a fifth comparative example.

If a heat radiation diffusion portion 661 is thinner as a fifth comparative example, heat radiation diffusion portion 661 will lack rigidity against the press load applied for integrating (caulking) power module unit 11 and a fin base 651 together (see FIG. 50). In this case, there is concern that heat radiation diffusion portion 661 may plastically deform into a curved shape as shown in FIG. 50.

In order to prevent such plastic deformation of heat radiation diffusion portion 661, the above-described semiconductor device 1 (see FIG. 46) has fin base 51 in which thickness TH of heat radiation diffusion portion 61 is larger than thickness TB of base portion 53.

The thickness required for heat radiation diffusion portion 61 of fin base 51 differs depending on the material of fin base 51, the press load, and the allowable deformation amount of heat radiation diffusion portion 61. If heat radiation diffusion portion 61 deforms by more than the allowable deformation amount, the following problems may occur.

A first possible problem is that holes 73 at the four corners of heat radiation diffusion portion 61 may be out of the positions for fixation in fixing chassis 83 (see FIG. 28), and semiconductor device 1 (fin base 51) cannot be fixed to fixing chassis 83 (problem A).

Another possible problem is that, in the process (caulking process) of fitting radiator fins 81 on fin base 51 (heat radiation diffusion portion 61), fin insertion grooves 67 may be out of the positions at which radiator fins 81 are to be fitted, and radiator fins 81 cannot be inserted in fin insertion grooves 67 (problem B).

Still another possible problem is an insufficient contact portion (contact area) between caulking portions 65 etc. and radiator fins 81 inserted in fin insertion grooves 67, leading to insufficient tensile strength in the insertion direction of radiator fins 81 (problem C).

Figure 51:
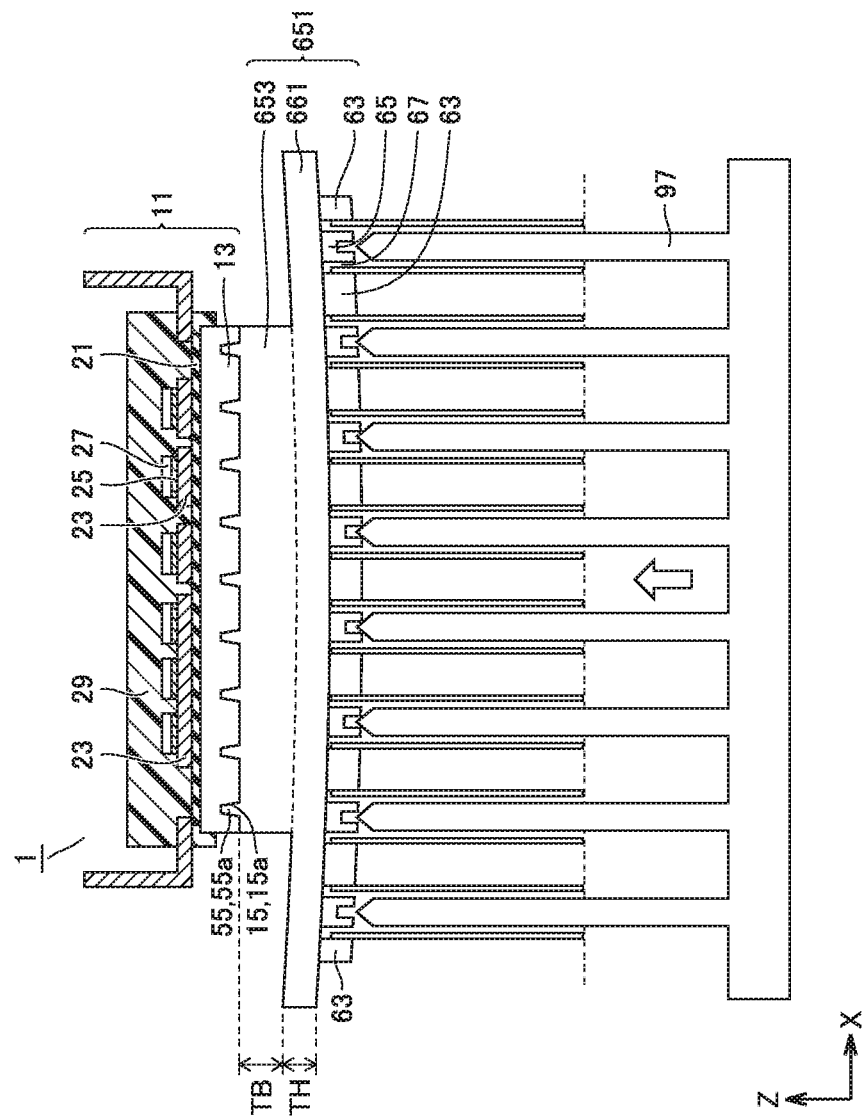
FIG. 51 is a side view including a partial cross section, showing one process in a method for manufacturing a semiconductor device, for explaining the problems of the semiconductor device in the fifth comparative example.

Problem B and problem C are described in more detail. Suppose heat radiation diffusion portion 661 plastically deforms into a curved shape as shown in FIG. 50. In this case, in the process (caulking process) of fitting radiator fins 81 on heat radiation diffusion portion 661, radiator fins 81 cannot be inserted deep into fin insertion grooves 67 as shown in FIG. 51. Accordingly, some radiator fins 81 may not come into contact with the lower surface of heat radiation diffusion portion 661.

At the time of caulking, a mechanism to press radiator fins 81 against the lower surface (fin contact surface) of heat radiation diffusion portion 661 is provided. Even with an elastic material for biasing radiator fins 81 attached to the mechanism, some radiator fins 81 may not come into contact with the lower surface (fin contact surface) of heat radiation diffusion portion 661, as shown in FIG. 51, depending on the amount of plastic deformation of heat radiation diffusion portion 661.

Further, if heat radiation diffusion portion 661 plastically deforms, the positions of fin insertion grooves 67 shift from before the plastic deformation of heat radiation diffusion portion 661. In this case, radiator fins 81, whose positions are fixed, may not be inserted in their corresponding fin insertion grooves 67 at the time of caulking. This may reduce the productivity.

Figure 52:
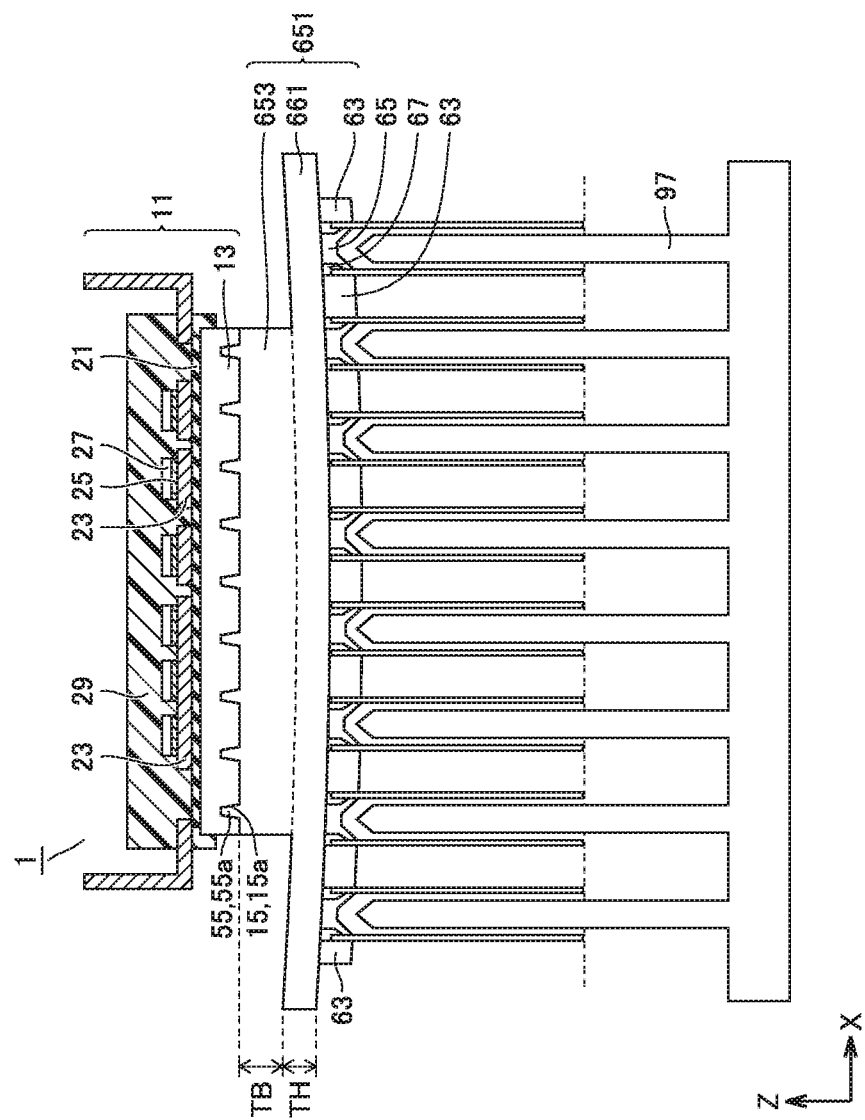
FIG. 52 is a side view including a partial cross section showing a process to be performed after the process shown in FIG. 51, for explaining the problems of the semiconductor device in the fifth comparative example.
Figure 53:
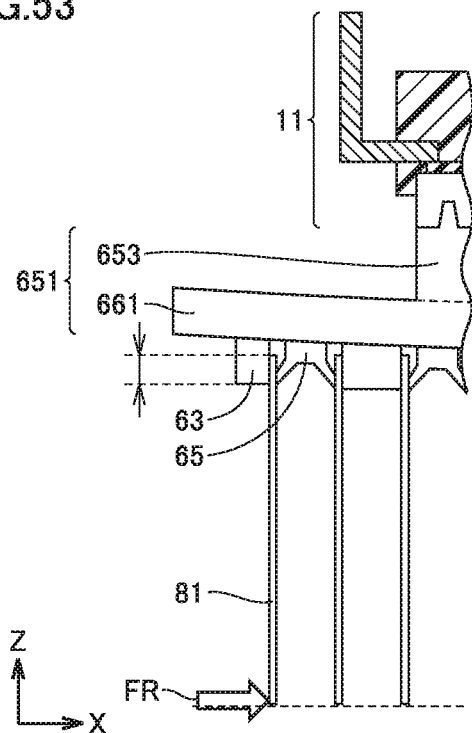
FIG. 53 is a partial side view including a partial cross section, for explaining the problems of the semiconductor device in the fifth comparative example.

Even if radiator fins 81 are inserted in their corresponding fin insertion grooves 67, there may be variations in contact length between radiator fins 81 and heat radiation diffusion portion 661. As shown in FIG. 52 and FIG. 53, at the central part of heat radiation diffusion portion 61, the contact length between convex wall portions 63 of heat radiation diffusion portion 661 and radiator fins 81 is sufficient. At the ends of heat radiation diffusion portion 661, however, the contact length between convex wall portions 63 of heat radiation diffusion portion 661 and radiator fins 81 is shorter.

Such a shorter contact length causes a higher contact thermal resistance between convex wall portions 63 of heat radiation diffusion portion 661 and radiator fins 81. This deteriorates the thermal resistance of the heat sink that comprises fin base 651 and radiator fins 81.

Further, a shorter contact length between convex wall portions 63 of heat radiation diffusion portion 661 and radiator fins 81 as shown in FIG. 53 will provide only a smaller strength against an external force FR applied to radiator fins 81. Although FIG. 53 shows a decreased strength against external force FR applied from the outside of radiator fins 81, the same applies to external force FR applied from the inside of radiator fins 81 or applied in the air pathway direction.

In view of such possible problems in terms of productivity and performance, heat radiation diffusion portion 61 has to be prevented from plastically deforming and curving in the process (caulking process) of fitting radiator fins 81 on fin base 51 (heat radiation diffusion portion 61).

The above-described semiconductor device (see FIG. 46) has fin base 51 in which thickness TH of heat radiation diffusion portion 61 is larger than thickness TB of base portion 53. Thus, heat radiation diffusion portion 61 is improved in rigidity and prevented from plastically deforming.

Next, variations of the semiconductor device in embodiment 2 are described. In the semiconductor device in each variation, the same members as those of the semiconductor device shown in FIG. 46 etc. are identically denoted, and the explanation thereof is not repeated unless required.

(First Variation)

As a semiconductor device in a first variation, one example variation of the fin base is described.

Figure 54:
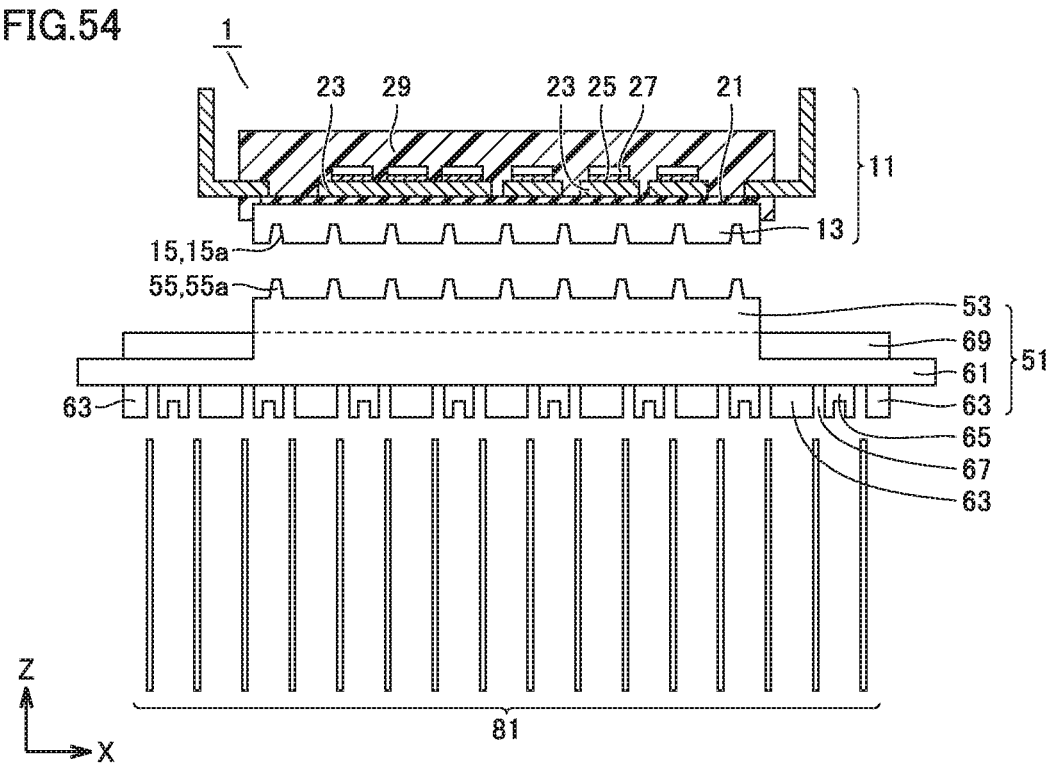
FIG. 54 is an exploded side view including a partial cross section of a semiconductor device in a first variation of the above-mentioned embodiment.

FIG. 54 shows an exploded side view including a partial cross section of semiconductor device 1. As shown in FIG. 54, in the semiconductor device in the first variation, deformation prevention portions 69 having a thickness are provided on heat radiation diffusion portion 61 of fin base 51, on the side where power module unit 11 is joined.

Figure 55:
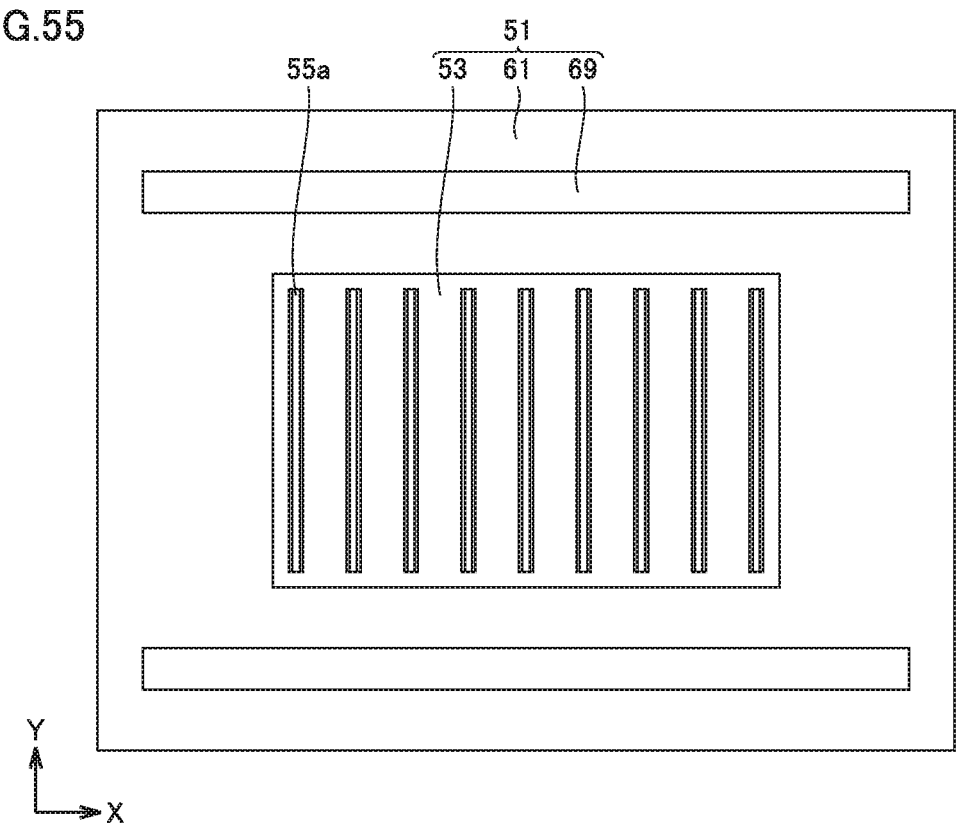
FIG. 55 is a top view of a fin base in the semiconductor device shown in FIG. 54 in the above-mentioned embodiment.
Figure 56:
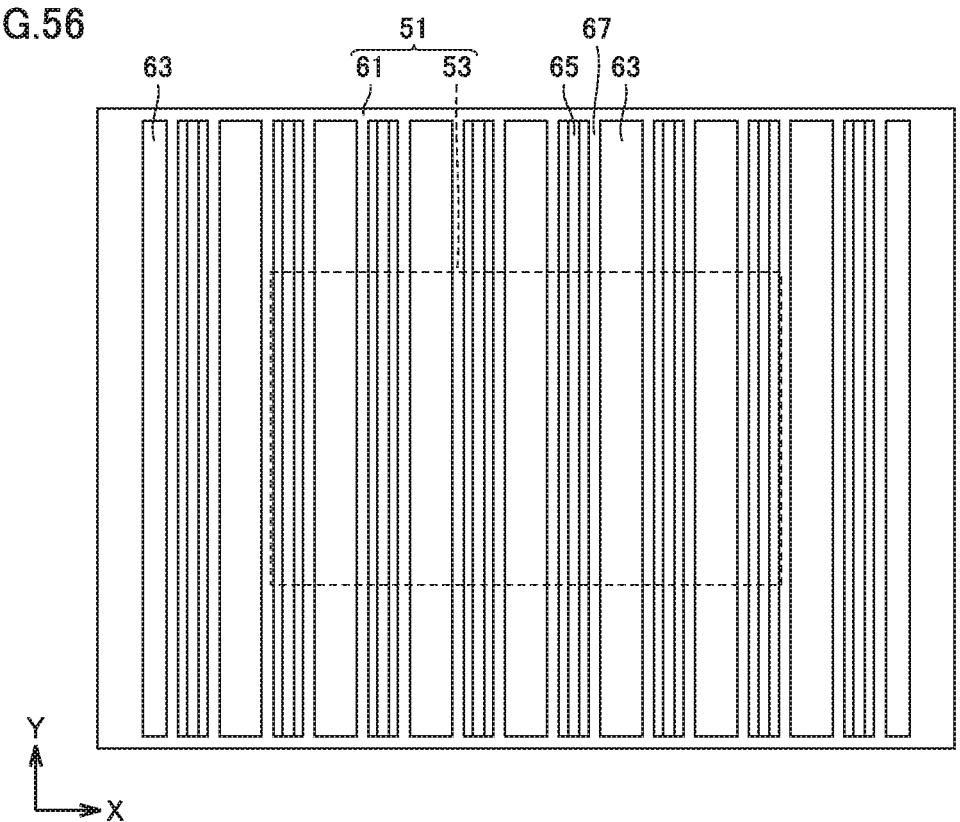
FIG. 56 is a bottom view of the fin base in the semiconductor device shown in FIG. 54 in the above-mentioned embodiment.

As shown in FIG. 55 and FIG. 56, two deformation prevention portions 69 are disposed at a distance in the Y-axis direction, with base portion 53 sandwiched between two deformation prevention portions 69. Each of two deformation prevention portions 69 extends along the X-axis direction. Deformation prevention portions 69, together with base portion 53, are formed integrally with heat radiation diffusion portion 61.

In semiconductor device 1 in the first variation, deformation prevention portions 69 having a thickness provided on heat radiation diffusion portion 61 can prevent heat radiation diffusion portion 61 from plastically deforming and curving when power module unit 11 is joined to fin base 51.

Figure 57:
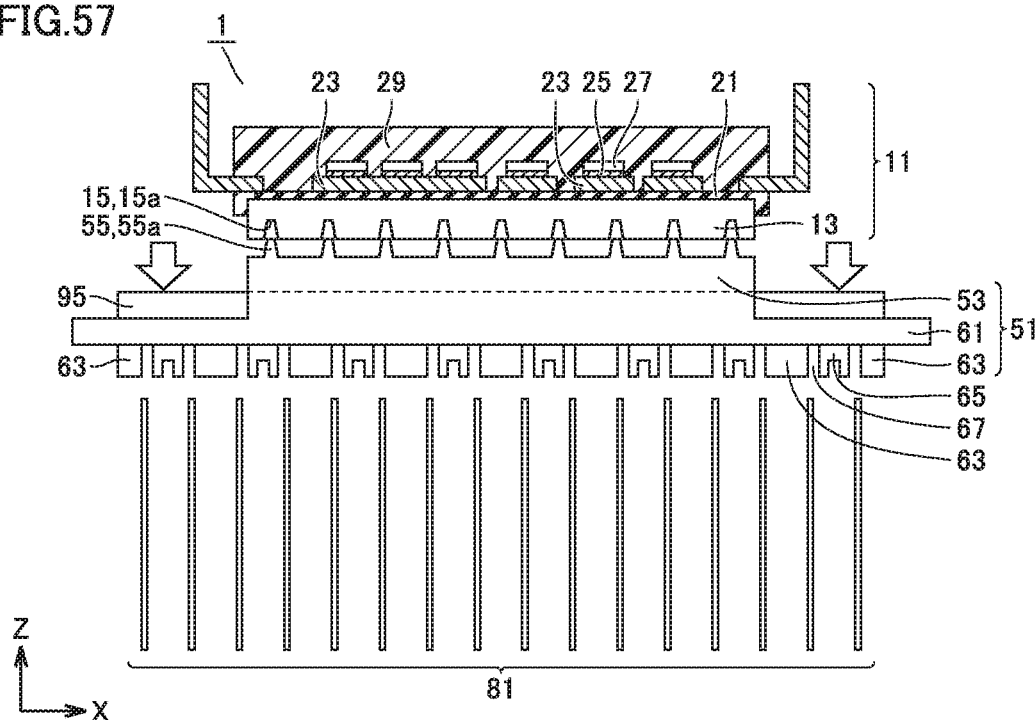
FIG. 57 is a side view including a partial cross section, showing one process in a method for manufacturing a semiconductor device in the first variation of the above-mentioned embodiment.

Instead of providing deformation prevention portions 69 on heat radiation diffusion portion 61, a support mechanism for supporting heat radiation diffusion portion 61 may be provided on a processing jig. Such a support mechanism can also prevent heat radiation diffusion portion 61 from plastically deforming. As shown in FIG. 57, support mechanism 95 provided on a processing jig touches and supports heat radiation diffusion portion 61 while power module unit 11 is joined to fin base 51. This can prevent heat radiation diffusion portion 61 from plastically deforming and curving.

(Second Variation)

As a semiconductor device in a second variation, another example variation of the fin base is described.

Figure 58:
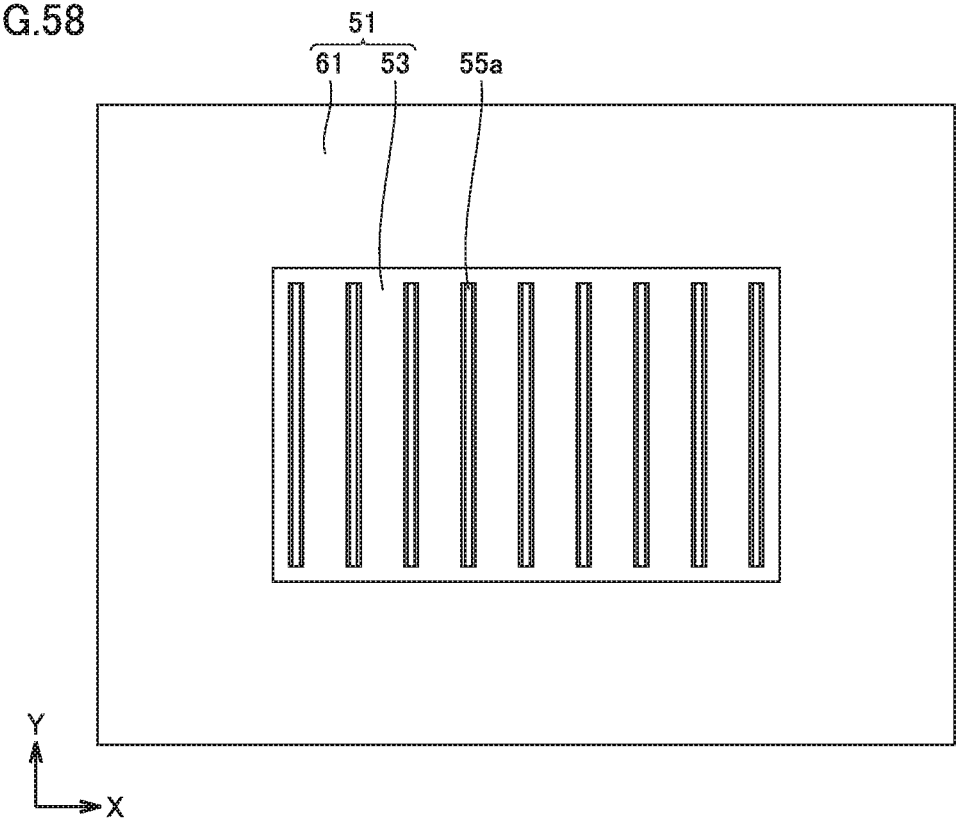
FIG. 58 is a top view of a fin base in a semiconductor device in a second variation of the above-mentioned embodiment.
Figure 59:
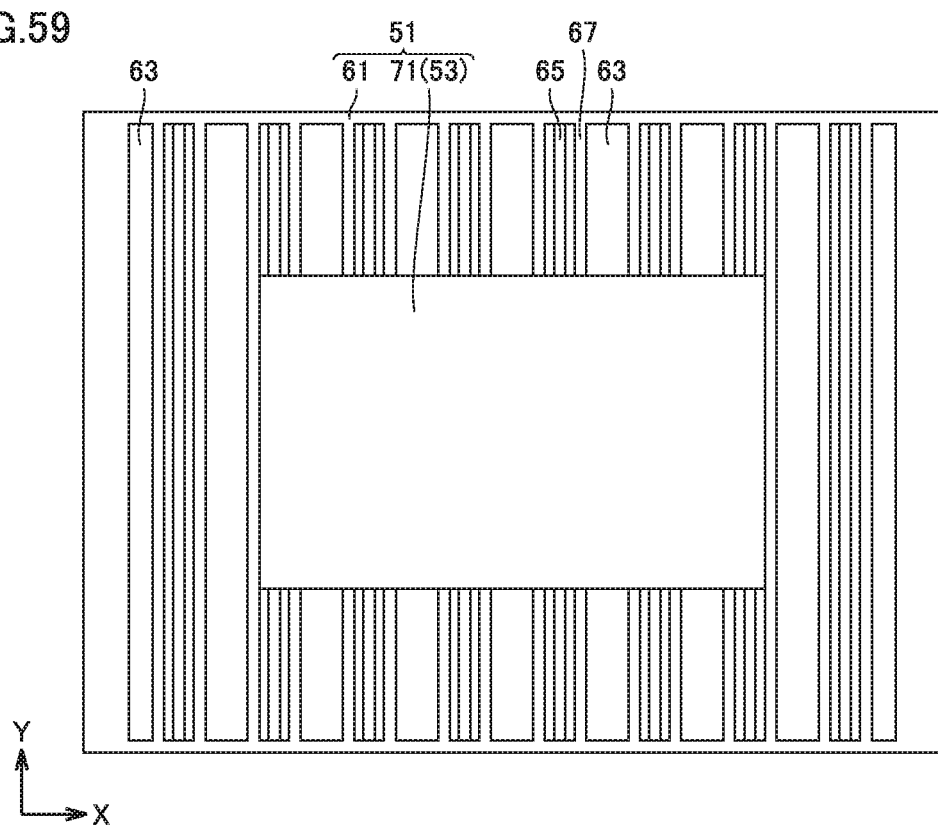
FIG. 59 is a bottom view of the fin base in the semiconductor device in the second variation of the above-mentioned embodiment.

As shown in FIG. 58 and FIG. 59, in the semiconductor device in the second variation, heat radiation diffusion portion 61 of fin base 51 includes a region 71 where no caulking portion 65 or convex wall portion 63 is formed. Region 71 is located at the position that faces the region where base portion 53 is disposed.

In the semiconductor device in the second variation, region 71 in heat radiation diffusion portion 61, where no caulking portion 65 or convex wall portion 63 is formed, can prevent heat radiation diffusion portion 61 from plastically deforming and curving when power module unit 11 is joined to fin base 51.

Figure 60:
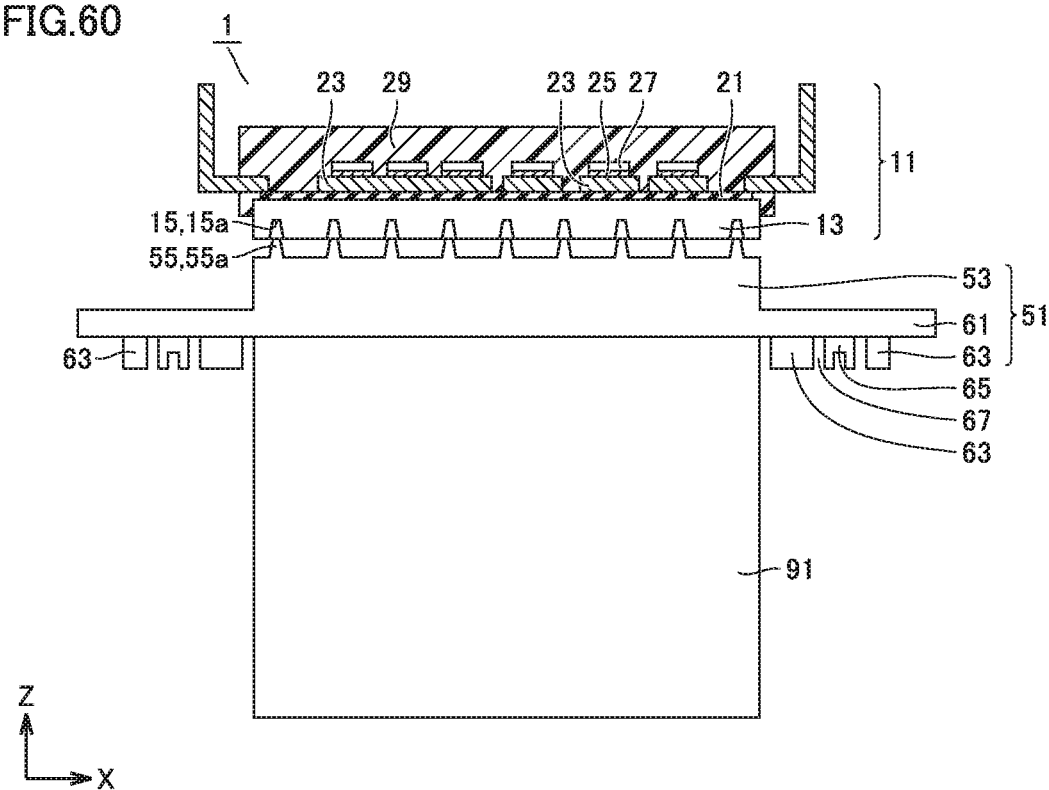
FIG. 60 is a side view including a partial cross section, showing one process in a method for manufacturing a semiconductor device in the second variation of the above-mentioned embodiment.

As shown in FIG. 60, when power module unit 11 is joined to fin base 51, a press load receiver 91 is brought into contact with region 71 where no caulking portion 65 or convex wall portion 63 is formed. This allows heat radiation diffusion portion 61 to be supported by press load receiver 91 and thus can be prevented from plastically deforming and curving.

(Third Variation)

Figure 61:
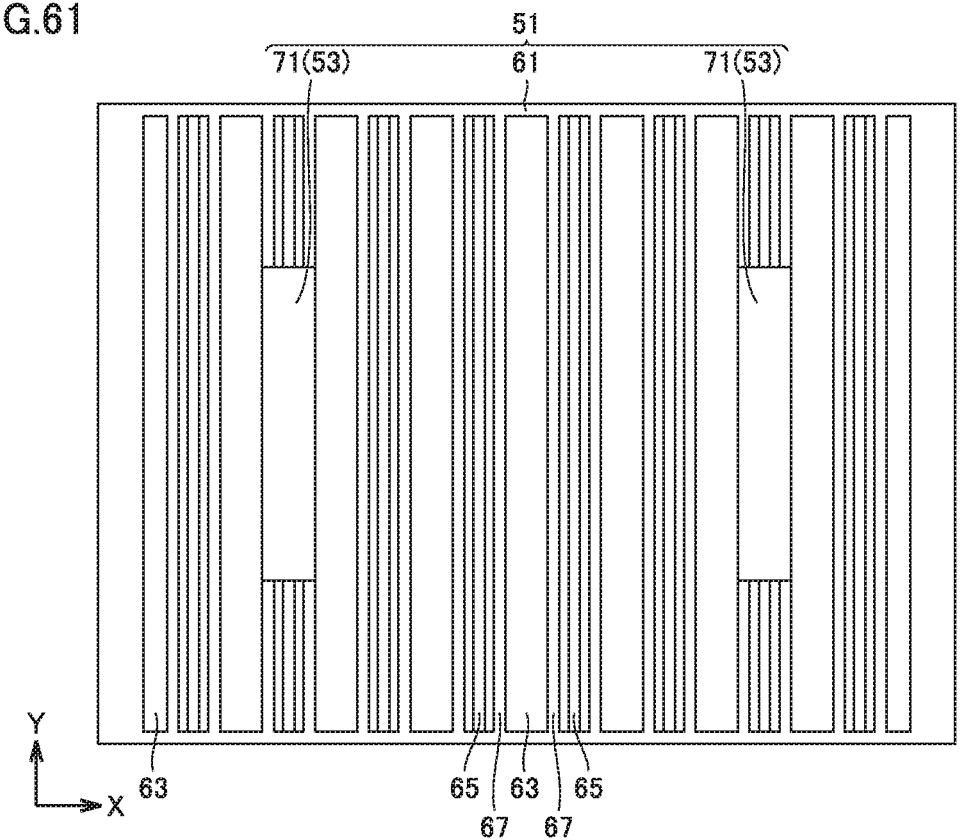
FIG. 61 is a plan view showing a fin base in a semiconductor device in a third variation of the above-mentioned embodiment.

From the viewpoint of heat radiation performance, it is preferable that the area of region 71 (press load receiver) in heat radiation diffusion portion 61, where no caulking portion 65 or convex wall portion 63 is formed, be as small as possible. If region 71, where no caulking portion 65 or convex wall portion 63 is formed, is provided immediately under module base 13 as shown in FIG. 60, then radiator fins are not disposed immediately under chip 27 mounted on power module unit 11. Thus, the heat radiation performance may decrease. Accordingly, for example, region 71 where no caulking portion 65 or convex wall portion 63 is formed may be divided into a plurality of sections, as shown in FIG. 61.

(Fourth Variation)

Two caulking processes may be performed to integrate power module unit 11, fin base 51, and radiator fins 81 together. Specifically, power module unit 11 (module base 13) and fin base 51 may be integrated together first, and then fin base 51 (heat radiation diffusion portion 61) and radiator fins 81 may be integrated together.

Figure 62:
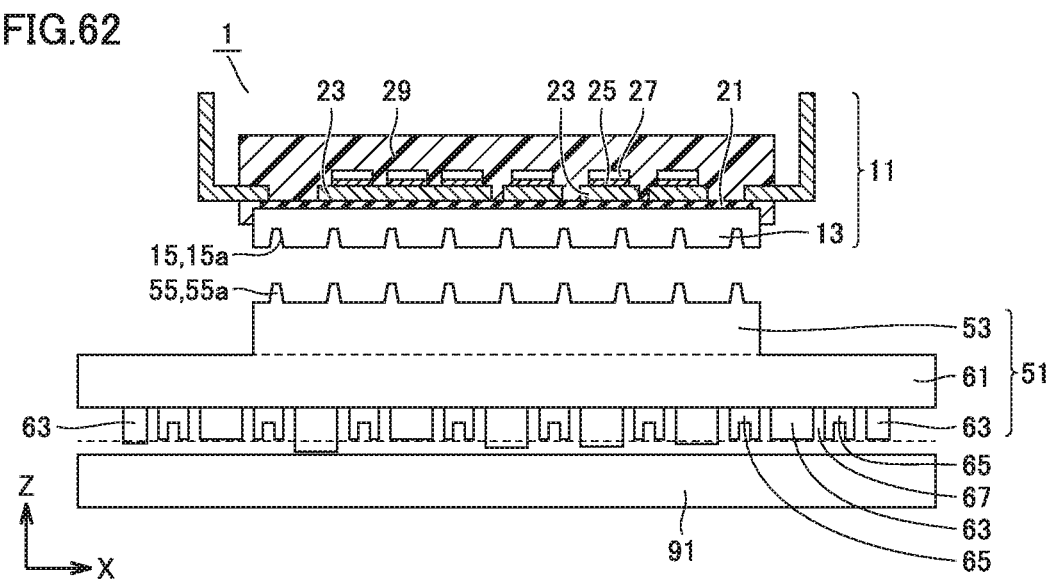
FIG. 62 is a side view including a partial cross section for explaining a semiconductor device in a fourth variation of the above-mentioned embodiment.

Fin base 51 is produced by machining, die casting, forging, or the like. Accordingly, as shown in FIG. 62, there may be variations in height of convex wall portions 63 on heat radiation diffusion portion 61, within a dimensional tolerance. In this state, when load is applied for caulking module base 13 and base portion 53 together and the load is received by convex wall portions 63 and press load receiver 91, then higher convex wall portions 63 may be subjected to stress concentration and thus may deform.

Figure 63:
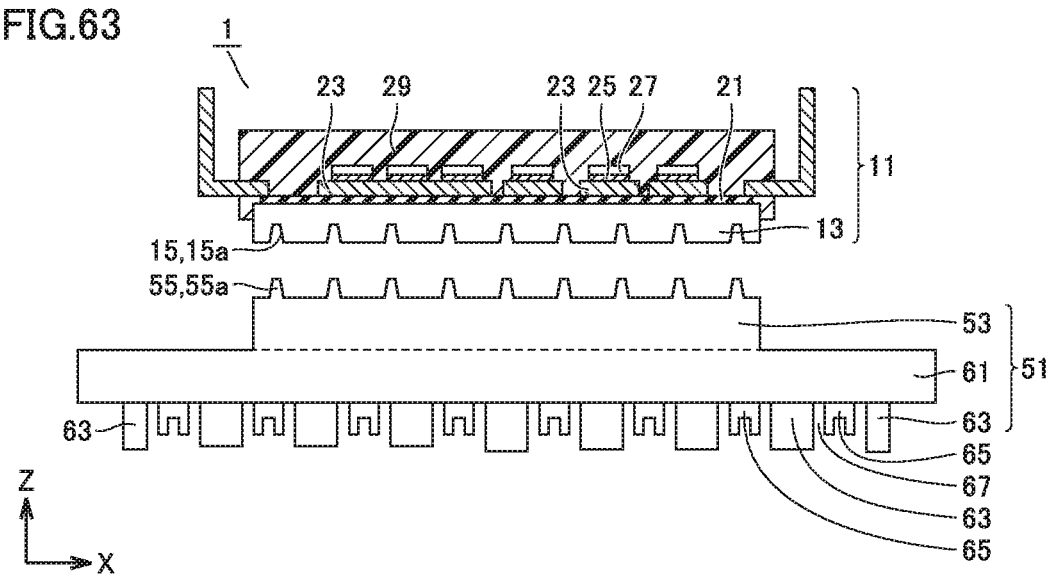
FIG. 63 is a side view including a partial cross section, showing one process in a method for manufacturing a semiconductor device in the fourth variation of the above-mentioned embodiment.
Figure 64:
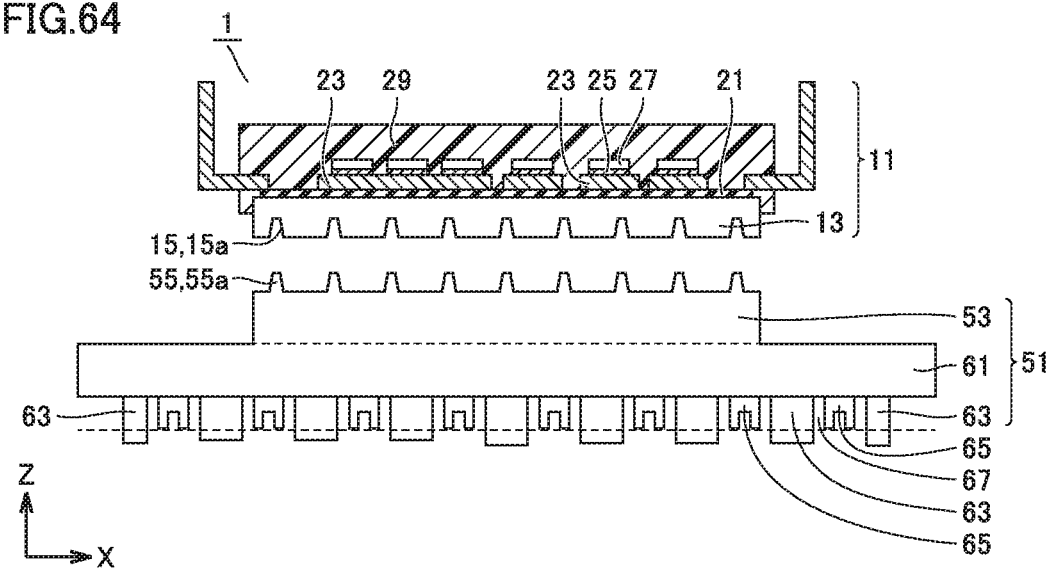
FIG. 64 is a side view including a partial cross section showing a process to be performed after the process shown in FIG. 63 in the above-mentioned embodiment.
Figure 65:
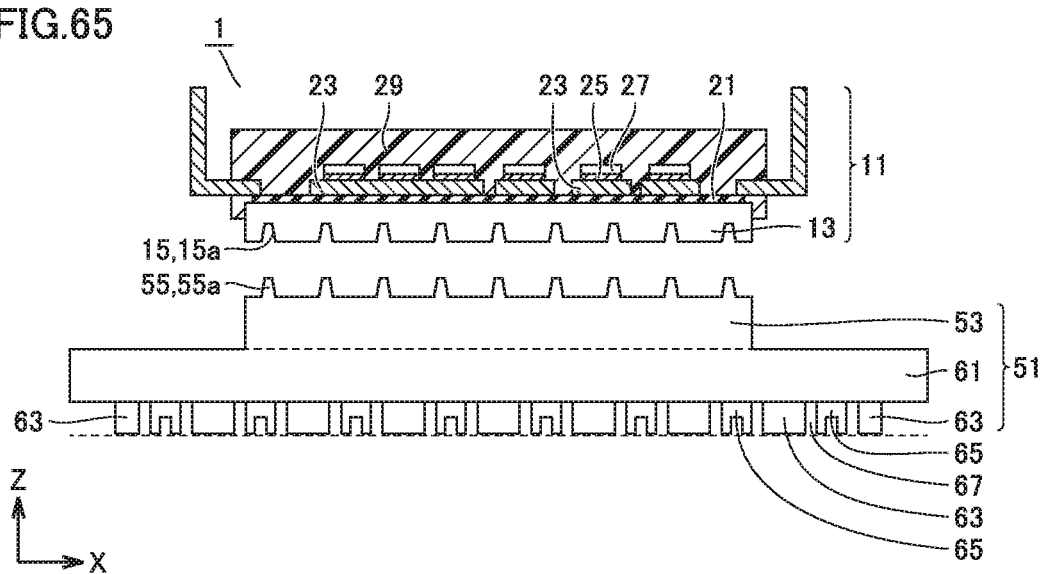
FIG. 65 is a side view including a partial cross section showing a process to be performed after the process shown in FIG. 64 in the above-mentioned embodiment.

Accordingly, in producing fin base 51, convex wall portions 63 are made higher than caulking portions 65 in advance as shown in FIG. 63. Next, as shown in FIG. 64 and FIG. 65, the parts of convex wall portions 63 that protrude from caulking portions 65 are cut by, for example, slicing so that the height of convex wall portions 63 is the same as the height of caulking portions 65.

Figure 66:
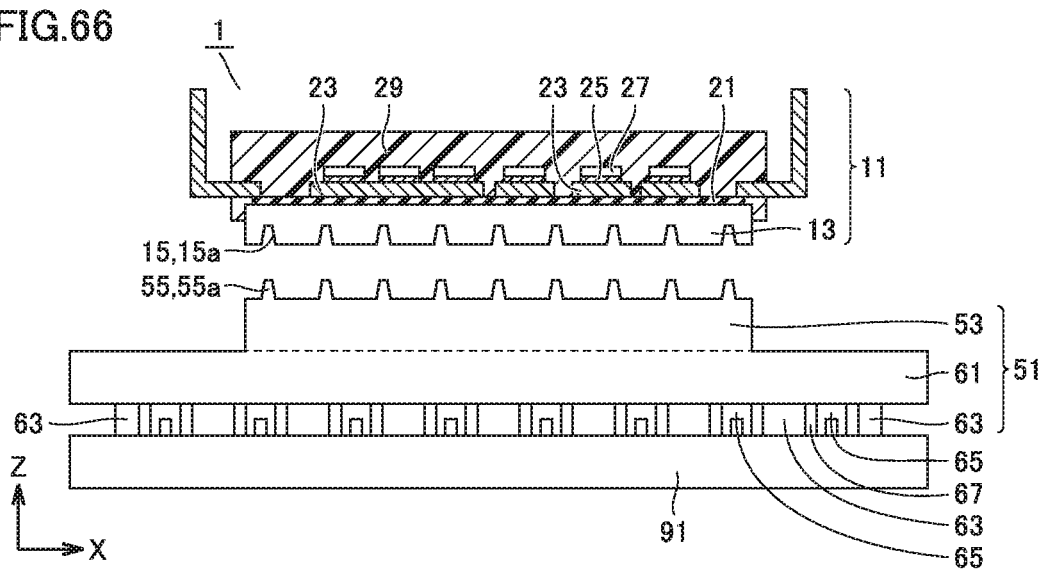
FIG. 66 is a side view including a partial cross section showing a process to be performed after the process shown in FIG. 65 in the above-mentioned embodiment.

Next, as shown in FIG. 66, power module unit 11 (module base 13) and fin base 51 are integrated together. At this time, the load for caulking module base 13 and base portion 53 together is received by convex wall portions 63, caulking portions 65, and press load receiver 91. Thus, power module unit 11 can be integrated with fin base 51 that does not include region 71 where no caulking portion 65 or convex wall portion 63 is formed. After that, radiator fins 81 (not shown) are caulked onto heat radiation diffusion portion 61 of fin base 51. Thus, power module unit 11, fin base 51, and radiator fins 81 are integrated together.

In the heat sink comprising fin base 51 and radiator fins 81, the contact thermal resistance of each contact portion between convex wall portion 63 of heat radiation diffusion portion 61 and a radiator fin is connected in parallel with one another, the number of the contact portions corresponding to the number of radiator fins. In the overall heat sink which has multiple radiator fins, the thermal resistance is the reciprocal of the sum total of the reciprocal of each thermal resistance. Therefore, a partial increase in contact thermal resistance, if any, affects the thermal resistance only slightly.

Embodiment 3

Figure 67:
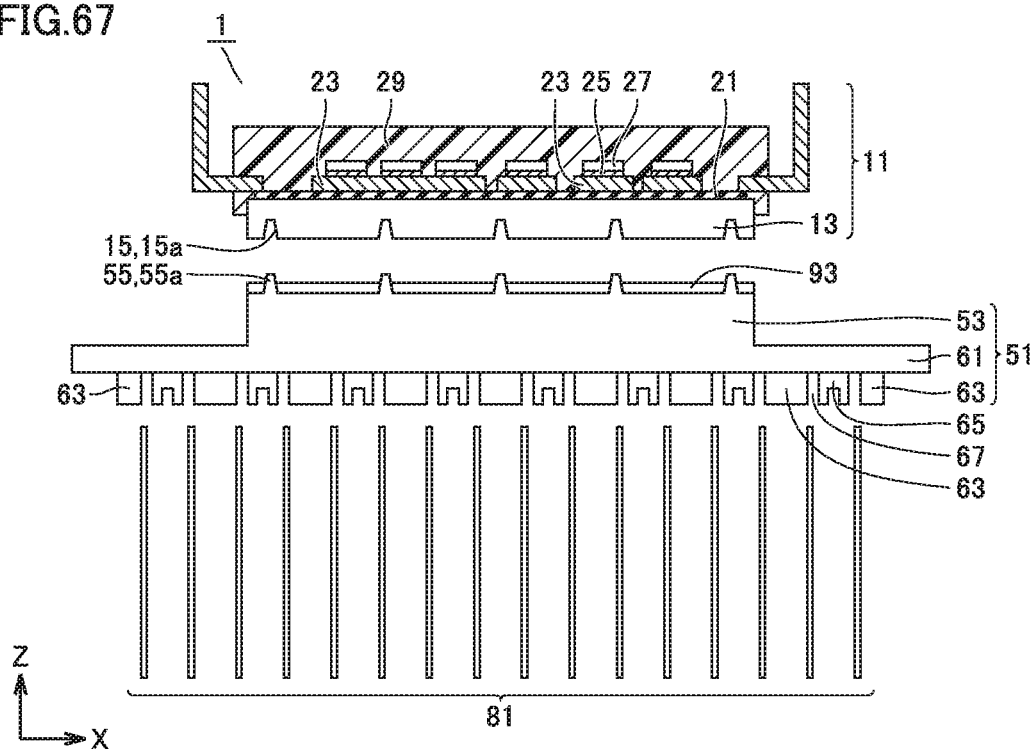
FIG. 67 is an exploded side view including a partial cross section of a semiconductor device in embodiment 3.

A semiconductor device in embodiment 3 is described. FIG. 67 shows an exploded side view including a partial cross section of the semiconductor device. As shown in FIG. 67, semiconductor device 1 includes power module unit 11, fin base 51, and a plurality of radiator fins 81.

A thermally conductive adhesive 93 or a thermally conductive grease is interposed between module base 13 and base portion 53. In the other respects, the semiconductor device is the same as the semiconductor device shown in FIG. 1 etc. Thus, the same members are identically denoted, and the explanation thereof is not repeated unless required.

In the above-described semiconductor device 1, the contact thermal resistance between module base 13 and base portion 53 can be reduced by thermally conductive adhesive 93 or the thermally conductive grease. Further, using thermally conductive adhesive 93 etc. ensures the joining strength between module base 13 and base portion 53 to some extent. Thus, the number of recess-projection portions 15 provided on module base 13 and the number of recess-projection portions 55 provided on base portion 53 can be reduced. The reduction in the number of recess-projection portions 15, 55 allows reduction in press load for joining (caulking) module base 13 and base portion 53 together. This can prevent heat radiation diffusion portion 61 of fin base 51 from plastically deforming and curving.

Next, a variation of the semiconductor device in embodiment 3 is described. In the semiconductor device in the variation, the same members as those of the semiconductor device shown in FIG. 67 are identically denoted, and the explanation thereof is not repeated unless required.

(Variation)

Figure 68:
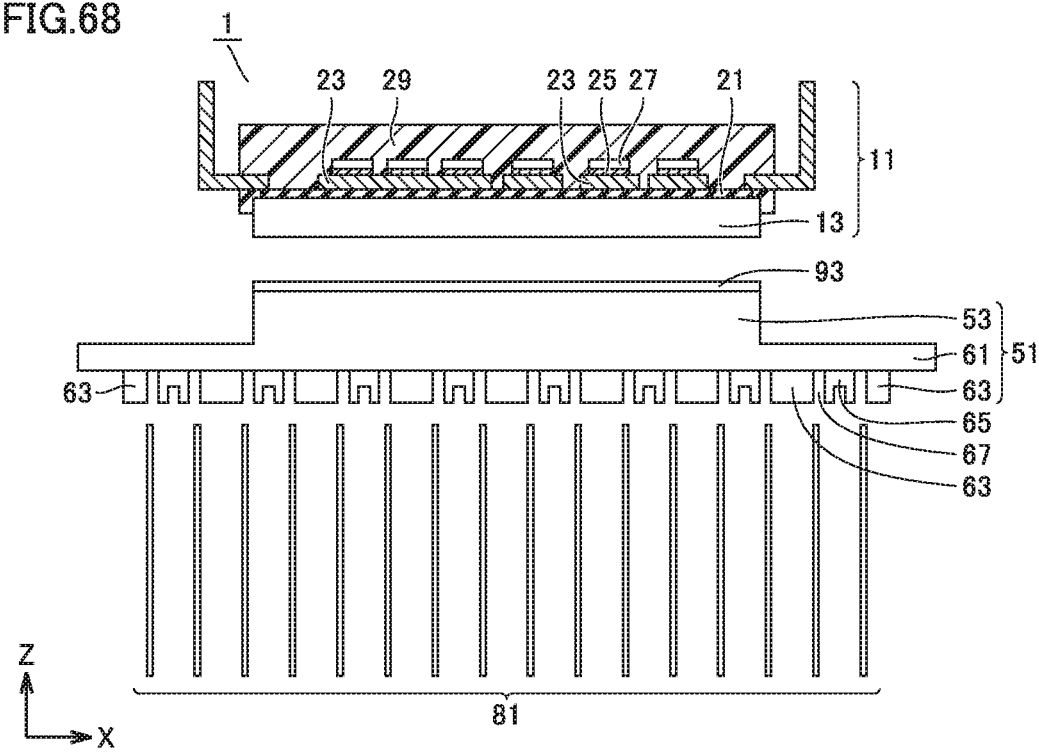
FIG. 68 is an exploded side view including a partial cross section of a semiconductor device in a variation of the above-mentioned embodiment.

FIG. 68 shows an exploded side view including a partial cross section of the semiconductor device. As shown in FIG. 68, in semiconductor device 1 in the variation, module base 13 and base portion 53 are joined (held) via thermally conductive adhesive 93.

If a sufficient joining strength (holding strength) between module base 13 and base portion 53 is ensured only via thermally conductive adhesive 93, module base 13 and base portion 53 may be joined (held) only via thermally conductive adhesive 93, with no recess-projection portion 15, 55 (see FIG. 67) provided.

The semiconductor devices described in the embodiments can be combined in various ways as appropriate.

The embodiments disclosed herein are by way of example and without limitation. The present invention is defined not by the above-described scope but by the terms of the claims, and is intended to include any modification within the meaning and scope equivalent to the terms of the claims.

INDUSTRIAL APPLICABILITY

The present invention is effectively applicable to a semiconductor device (power module) integrated with a heat sink.

REFERENCE SIGNS LIST

1: semiconductor device; 11: power module unit; 13: module base; 15: recess-projection portion; 15a, 15b: recess; 15f: flat portion; 17: recess-projection portion; 17a, 17b: projection; 17f: flat portion; 21: insulating sheet; 23: lead frame; 25: solder; 27: chip; 29: mold resin; 51: fin base; 53: base portion; 55: recess-projection portion; 55a, 55b: projection; 57: recess-projection portion; 57a, 57b: recess; 61: heat radiation diffusion portion; 63: convex wall portion; 65: caulking portion; 67: fin insertion groove; 69: deformation prevention portion; 71: region; 73: hole; 81, 81a, 81b: radiator fin; 83: chassis; 85: bolt; 91: press load receiver; 93: thermally conductive adhesive; 95: support mechanism; 97: press blade; 98: heat block; 99a: first clamping jig; 99b: second clamping jig; TB, TH: thickness; FR: external force; R1: region

The invention claimed is:

1. A semiconductor device comprising a power module unit, a fin base, and a radiator fin,
the power module unit including:
a module base,
a lead frame disposed on a surface of the module base, with an insulating sheet interposed between the lead frame and the surface of the module base,
a power semiconductor element mounted on a surface of the lead frame, and
a mold resin sealing the power semiconductor element, the fin base including:
a heat radiation diffusion portion fitted with the radiator fin, and
a base portion formed on the heat diffusion portion, the module base being joined to the base portion,
the heat radiation diffusion portion being larger in cross-sectional area than the module base.

2. The semiconductor device according to claim 1, wherein
the module base has a first recess-projection portion, and
the base portion has a second recess-projection portion fitted to the first recess-projection portion.

3. The semiconductor device according to claim 2, wherein
the first recess-projection portion has a part that continuously extends in a first direction, and
the second recess-projection portion has a part that continuously extends in the first direction.

4. The semiconductor device according to claim 2, wherein at least one of the first recess-projection portion and the second recess-projection portion has a discontinuous part.

5. The semiconductor device according to claim 1, wherein
in the fin base,
the base portion has a first thickness,
the heat radiation diffusion portion has a second thickness, and
the second thickness is larger than the first thickness.

6. The semiconductor device according to claim 1, wherein a deformation prevention portion is formed on a first side of the heat radiation diffusion portion, the first side being a side where the base portion is formed, the deformation prevention portion having a thickness and extending in a region other than a region where the base portion is formed.

7. The semiconductor device according to claim 1, wherein a caulking portion is formed on a second side of the heat radiation diffusion portion, the second side being a side where the radiator fin is fitted, the caulking portion allowing the radiator fin to be fitted.

8. The semiconductor device according to claim 7, wherein the caulking portion extends in a second direction.

9. The semiconductor device according to claim 7, wherein
one convex wall portion and another convex wall portion are formed at an interval on the second side of the heat radiation diffusion portion, and
in a region between the one convex wall portion and the other convex wall portion, the caulking portion is formed in an area other than a part of the region.

10. The semiconductor device according to claim 2, wherein any one of a thermally conductive adhesive and a thermally conductive grease is interposed between the first recess-projection portion of the module base and the second recess-projection portion of the base portion.

11. The semiconductor device according to claim 1, wherein any one of a thermally conductive adhesive and a thermally conductive grease is interposed between the module base and the base portion.

12. The semiconductor device according to claim 1, wherein, the base portion is formed on a surface of the heat radiation diffusion portion that faces towards a side on which the module base is located, and the base portion is located between the heat radiation diffusion portion and the module base.

13. The semiconductor device according to claim 1, wherein the fin base is integrally formed from any of aluminum and an aluminum alloy.

\* \* \* \* \*